US011081602B2

(12) United States Patent
Fujita

(10) Patent No.: US 11,081,602 B2
(45) Date of Patent: Aug. 3, 2021

(54) OPTICAL SEMICONDUCTOR DEVICE

(71) Applicant: Mitsubishi Electric Corporation, Tokyo (JP)

(72) Inventor: Koichi Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/755,375

(22) PCT Filed: Nov. 27, 2017

(86) PCT No.: PCT/JP2017/042342
§ 371 (c)(1),
(2) Date: Apr. 10, 2020

(87) PCT Pub. No.: WO2019/102605
PCT Pub. Date: May 31, 2019

(65) Prior Publication Data
US 2021/0175379 A1      Jun. 10, 2021

(51) Int. Cl.
*H01L 31/02*       (2006.01)
*H01L 31/0232*     (2014.01)
*H01L 31/167*      (2006.01)
*H01L 31/0203*     (2014.01)
*H01L 31/101*      (2006.01)

(52) U.S. Cl.
CPC .... *H01L 31/02327* (2013.01); *H01L 31/0203* (2013.01); *H01L 31/101* (2013.01); *H01L 31/167* (2013.01)

(58) Field of Classification Search
CPC ............ H01L 31/02327; H01L 31/167; H01L 31/0203; H01L 31/101
See application file for complete search history.

(56) References Cited

U.S. PATENT DOCUMENTS

2007/0278604 A1   12/2007   Minixhofer
2009/0097010 A1    4/2009   Yamaguchi
2016/0104741 A1    4/2016   Enichlmair et al.

FOREIGN PATENT DOCUMENTS

| JP | H11-026800 A | 1/1999 |
| JP | H11-168172 A | 6/1999 |
| JP | 2002-134764 A | 5/2002 |
| JP | 2002-353494 A | 12/2002 |

(Continued)

OTHER PUBLICATIONS

International Search Report issued in PCT/JP2017/042342; dated Dec. 26, 2017.

*Primary Examiner* — Matthew L Reames
(74) *Attorney, Agent, or Firm* — Studebaker & Brackett PC

(57) ABSTRACT

An optical semiconductor device of the invention includes: a semiconductor substrate; an optical communication unit that is provided on the semiconductor substrate, as a light receiving unit for receiving an optical signal or a light emitting unit for emitting an optical signal; an interlayer film that covers the semiconductor substrate and the optical communication unit; a Fresnel lens through which the optical signal passes, that is provided on a planarized surface of the interlayer film placed on its side farther from the semiconductor substrate; and a protective film that covers the Fresnel lens and the interlayer film, whose refractive index is larger than that of the interlayer film, and whose surface placed on its side farther from the interlayer film is planarized.

11 Claims, 12 Drawing Sheets

(56) References Cited

FOREIGN PATENT DOCUMENTS

| | | | |
|---|---|---|---|
| JP | 2004-247458 | A | 9/2004 |
| JP | 2005-116709 | A | 4/2005 |
| JP | 2007-534158 | A | 11/2007 |
| JP | 4152684 | B2 | 9/2008 |
| JP | 2009-097872 | A | 5/2009 |
| JP | 4984170 | B2 | 7/2012 |
| JP | 2013-160509 | A | 8/2013 |
| JP | 2016-526155 | A | 9/2016 |

OPTICAL SEMICONDUCTOR DEVICE

TECHNICAL FIELD

The present invention relates to an optical semiconductor device that is a light-handling semi-conductor device, such as: a planar light receiving semiconductor device for receiving (accepting) light; a planar light emitting semiconductor device for emitting (transmitting) light; or a semiconductor device including optical elements, such as, a planar light receiving element for receiving light and a planar light emitting element for emitting light.

BACKGROUND ART

In Patent Document 1, an optical distance sensor is disclosed in which a light emitting element, a position-detection light-receiving element and an integrated circuit for control processing are mounted on a lead frame and a light-emission side lens and a light-reception side lens are paired and placed respectively above the light emitting element and the position-detection light-receiving element, namely, which is configured as a hybrid integrated circuit (module). In Patent Document 2, an optical semiconductor element (semiconductor device) is disclosed in which an optical element and an electrically functional element are formed in an epitaxial layer on a semiconductor substrate, a cap substrate on which a micro lens is formed is placed above the semiconductor substrate, and an inner region between the semiconductor substrate and the cap substrate is sealed by means of a sealing structure formed on the outer circumferential side of them, namely, which is configured as a hybrid integrated circuit (module). In Patent Document 3, a light receiving module is disclosed in which an integrated circuit component and a photoelectric conversion element are embedded by heating and pressing in an organic film in which a wiring pattern is formed, and a convex lens is formed on a surface of the organic film placed above the photoelectric conversion element. In Patent Document 4, an infrared-light receiving integrated circuit is disclosed in which a lens is formed on the back side of a silicon wafer having an infrared-light receiving element mounted thereon.

CITATION LIST

Patent Document

Patent Document 1: Japanese Patent Application Laid-open No. 2009-97872 (FIG. 1)
Patent Document 2: Japanese Patent Publication No. 4984170 (FIG. 1)
Patent Document 3: Japanese Patent Publication No. 4152684 (FIG. 3)
Patent Document 4: Japanese National Publication of International Patent Application No. 2016-526155

SUMMARY OF THE INVENTION

Problems to be Solved by the Invention

Heretofore, in semiconductor integrated circuits, it is usual that signal processing is associated with signal transmission between functional circuits by use of aluminum or like metal wiring. However, according to the semiconductor integrated circuits using electrical signals through the metal wirings, with the progress of enlargement in volume of transmitted information and speed-up of communication speed, their increased power consumption and their signal processing speed come close to the allowable limits. Thus, it is urgently required to put into practical use, for example, an optical semiconductor device capable of establishing signal transmission between functional circuits using an optical signal. The conventional optical semiconductor devices disclosed in Patent Documents 1 to 3, each including a light emitting element or/and alight receiving element, are each configured as a hybrid integrated circuit, so that, in order to converge an optical signal(s) from the light emitting element or/and for the light receiving element, it is required to attach a separate lens that is other than a semiconductor device, to the semiconductor device after manufacturing thereof. Thus, according to the conventional optical semiconductor device, in association with increased number of the components, the number of manufacturing steps thereof increases. This also limits the optical semiconductor device from being downsized.

In order to solve the problems as described above, an object of this invention is to achieve a light-handling optical semiconductor device which can reduce the number of the components and the number of the manufacturing steps, and can be downsized.

Means for Solving the Problems

An optical semiconductor device of this invention comprises: a semiconductor substrate; an optical communication unit that is provided on the semiconductor substrate, as a light receiving unit for receiving an optical signal or a light emitting unit for emitting an optical signal; an interlayer film that covers the semiconductor substrate and the optical communication unit; a Fresnel lens through which the optical signal passes, that is provided on a planarized surface of the interlayer film placed on its side farther from the semiconductor substrate; and a protective film that covers the Fresnel lens and the interlayer film, whose refractive index is larger than that of the interlayer film, and whose surface placed on its side farther from the interlayer film is planarized.

Effect of the Invention

According to the optical semiconductor device of the invention, since the Fresnel lens through which the optical signal passes is provided on the planarized surface of the interlayer film that covers the optical communication unit for receiving or emitting the optical signal, and the planarized protective film covers the Fresnel lens and the interlayer film, it is possible to reduce the number of the components and the number of the manufacturing steps, and to achieve downsizing.

MODES FOR CARRYING OUT THE INVENTION

Here, with respect to an optical signal that is a signal of light, the phrase of "accepts the optical signal" will be expressed as "receives the optical signal", and the phrase of "transmits the optical signal" will be expressed as "emits the optical signal".

Embodiment 1

Figure 1:
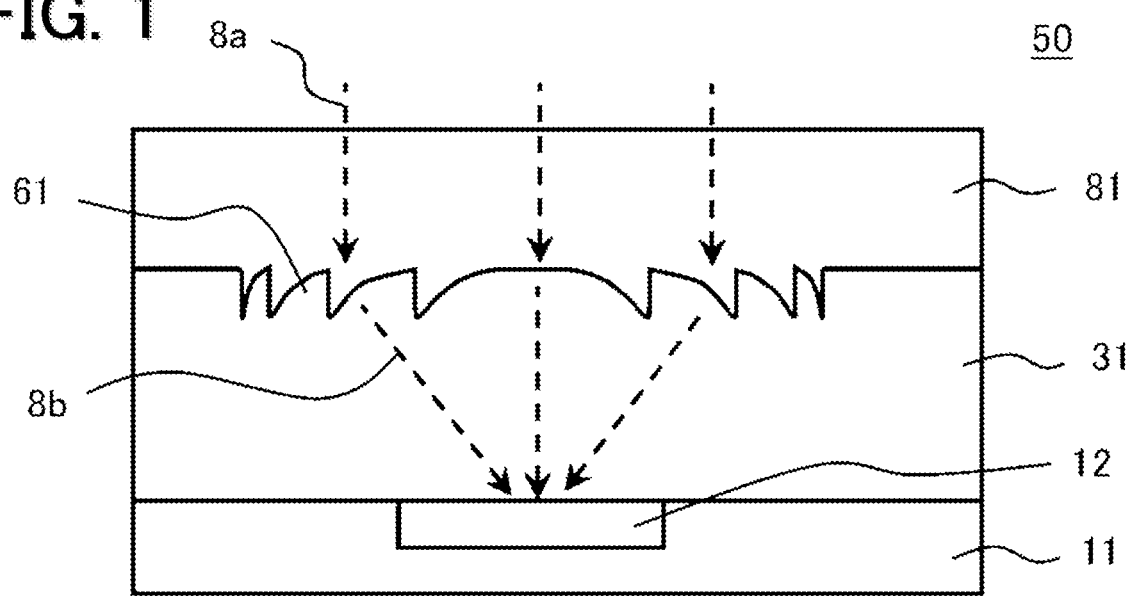
FIG. 1 is a schematic diagram showing a cross-sectional structure of an optical semiconductor device according to Embodiment 1 of the invention.
Figure 8:
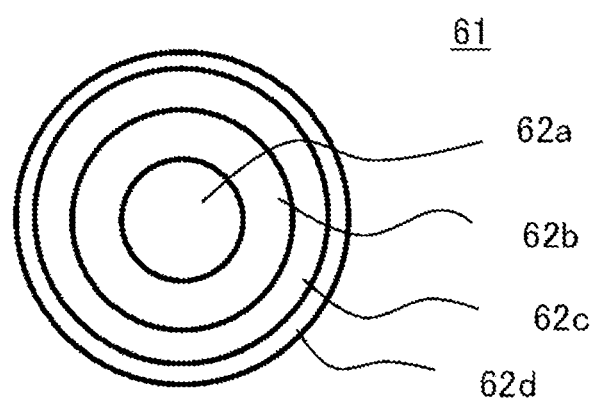
FIG. 8 is a diagram showing a first example of the top-view shape of a Fresnel lens in FIG. 1.
Figure 9:
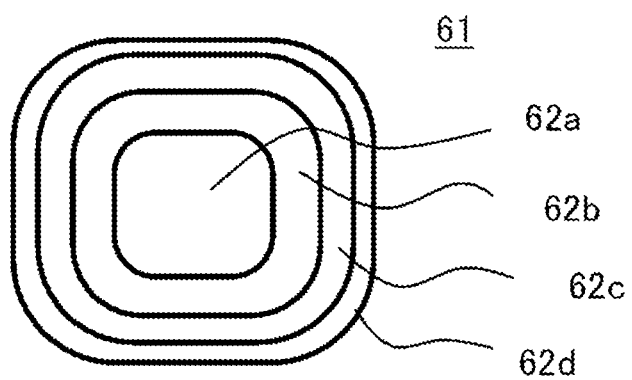
FIG. 9 is a diagram showing a second example of the top-view shape of the Fresnel lens in FIG. 1.
Figure 10:
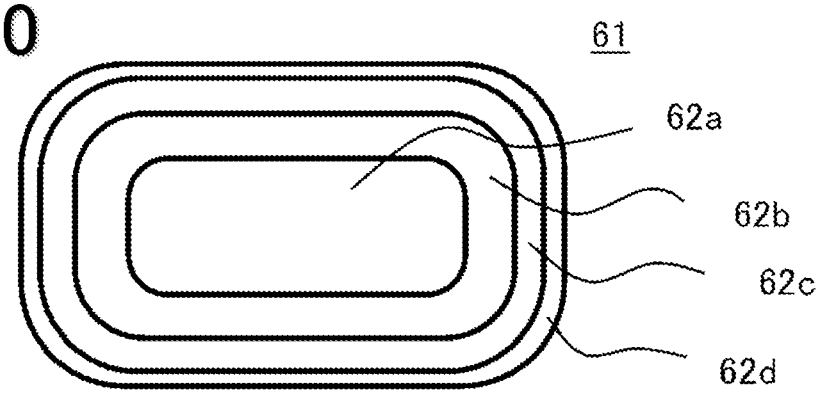
FIG. 10 is a diagram showing a third example of the top-view shape of the Fresnel lens in FIG. 1.

In the following, an optical semiconductor device for receiving light, which is an embodiment of the invention and represented by an avalanche photodiode (APD) or the like, will be described. FIG. 1 is a schematic diagram showing a cross-sectional structure of an optical semiconductor device according to Embodiment 1 of the invention. FIG. 2 to FIG. 7 are diagrams each illustrating a wafer manufacturing step for the optical semiconductor device of FIG. 1. FIG. 8 to FIG. 10 are diagrams showing first to third examples of the top-view shape of a Fresnel lens in FIG. 1. An optical semiconductor device 50 of Embodiment 1 includes: a semiconductor substrate 11; a light receiving unit 12 that is provided on the semiconductor substrate 11, for receiving an optical signal 8*a*, 8*b*; an interlayer film 31 as a $SiO_2$-based film; a Fresnel lens 61 provided on a surface of the interlayer film 31; and a protective film 81 as a SiN film that covers the Fresnel lens 61. The semiconductor substrate 11 is a semiconductor substrate made of a single element or a chemical compound. The light receiving unit is a receiver unit having a receiving function in an optical communication unit for establishing optical signal communication.

Figure 2:
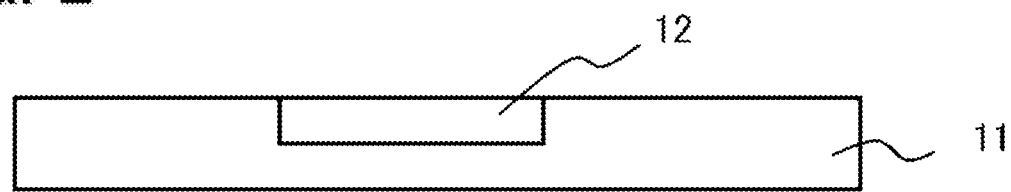
FIG. 2 is a diagram illustrating a wafer manufacturing step for the optical semiconductor device of FIG. 1.
Figure 3:
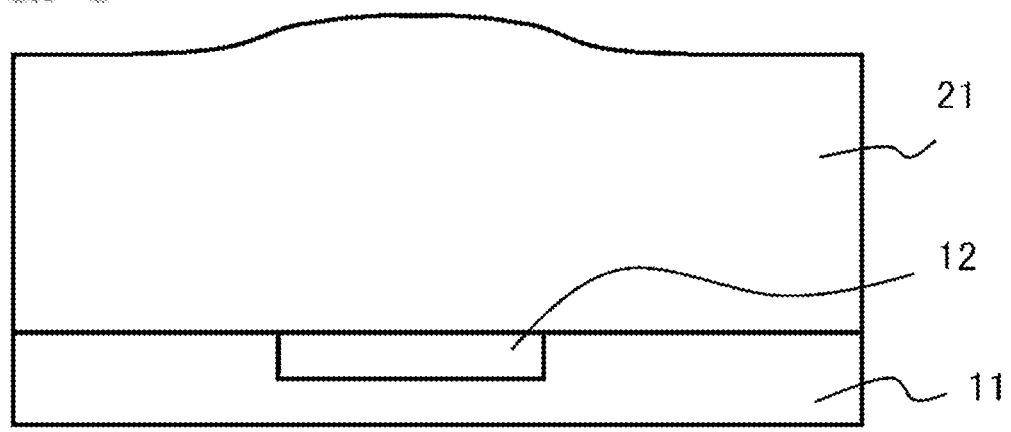
FIG. 3 is a diagram illustrating a wafer manufacturing step for the optical semiconductor device of FIG. 1.
Figure 4:
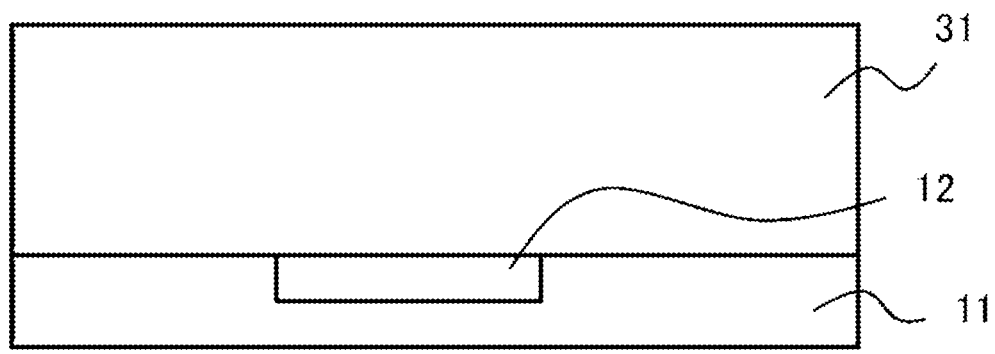
FIG. 4 is a diagram illustrating a wafer manufacturing step for the optical semiconductor device of FIG. 1.

Wafer manufacturing steps for the optical semiconductor device 50 of Embodiment 1 will be described. First, in the manufacturing step of a substrate before lens formation, as shown in FIG. 2, the light receiving unit 12 is formed on the semiconductor substrate 11. The semiconductor substrate 11 on which the light receiving unit 12 is formed is the substrate before lens formation. As shown in FIG. 3, on the semiconductor substrate 11 on which the light receiving unit 12 is formed, an interlayer film 21 that is an interlayer film as a $SiO_2$-based film (silicon-based oxide film) having a film thickness of 1.0 to 5.0 μm, is deposited by a CVD (Chemical Vapor Deposition) method or the like. Due to the thicknesses of the light receiving unit 12 and wired electrodes (not shown) formed on the semiconductor substrate 11 under the interlayer film 21, there is undulation on the surface of the interlayer film 21. As shown in FIG. 4, the interlayer film 21 is planarized such that the surface thereof is polished by a CMP (Chemical Mechanical Polish) method until the film thickness reaches 0.5 to 3.0 μm. An interlayer film corresponding to the thus-polished interlayer film 21 is indicated by numeral 31. Note that in FIG. 1 to FIG. 7, a case is shown where the surface of the light receiving unit 12 and the surface of the semiconductor substrate 11 are coplanar; however, such a case may also arise where the surface of the light receiving unit 12 is positioned higher (nearer to the Fresnel lens 61) than the surface of the semiconductor substrate 11, or where the surface of the light receiving unit 12 is positioned lower (nearer to the back side of the semiconductor substrate 11) than the surface of the semiconductor substrate 11.

Figure 5:
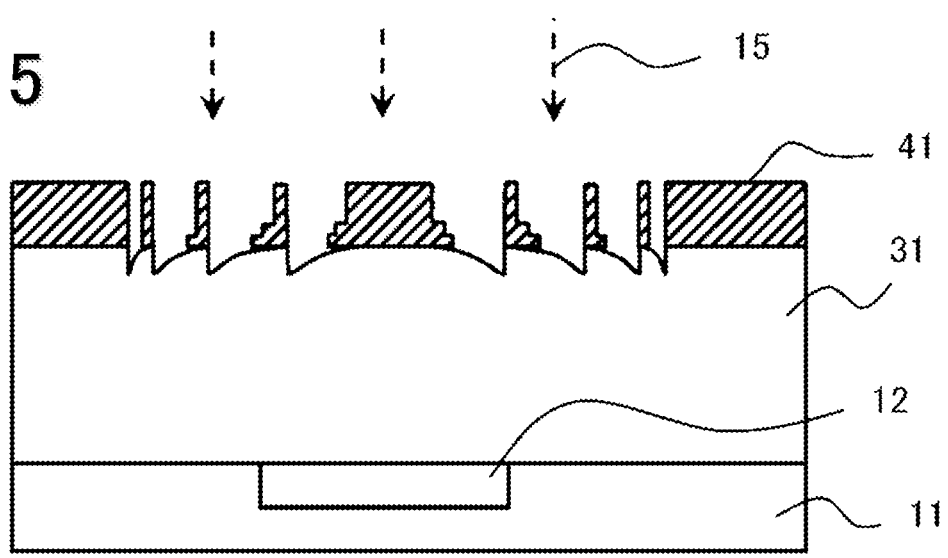
FIG. 5 is a diagram illustrating a wafer manufacturing step for the optical semiconductor device of FIG. 1.

Then, in order to form the Fresnel lens 61 on the surface of the interlayer film 31, a resist pattern 41 for forming the Fresnel lens is developed by a multi-exposure photolithographic technique using an electron beam method (EB (Electron Beam) method). The resist pattern 41 is formed to be matched to the shapes of concave portions of the Fresnel lens 61, for example, it is formed so as to have stepped shapes in each of which the thickness corresponding to a deep region in the concave portion is thin whereas the thickness corresponding to a shallow region in said concave portion is thick. As shown in FIG. 5, the concave portions of the Fresnel lens 61 are formed in the interlayer film 31 by a dry etching method, so that convex portions 62*a*, 62*b*, 62*c* and 62*d* are formed. FIG. 5 shows concave portions of the Fresnel lens 61 during etching, and shows a state where the resist pattern 41 is left on the convex portions of the Fresnel lens 61 after resist portions for the respective deep regions in the concave portions have disappeared gradually with the progress of etching by etching ions 15 for the concave portions.

Figure 6:
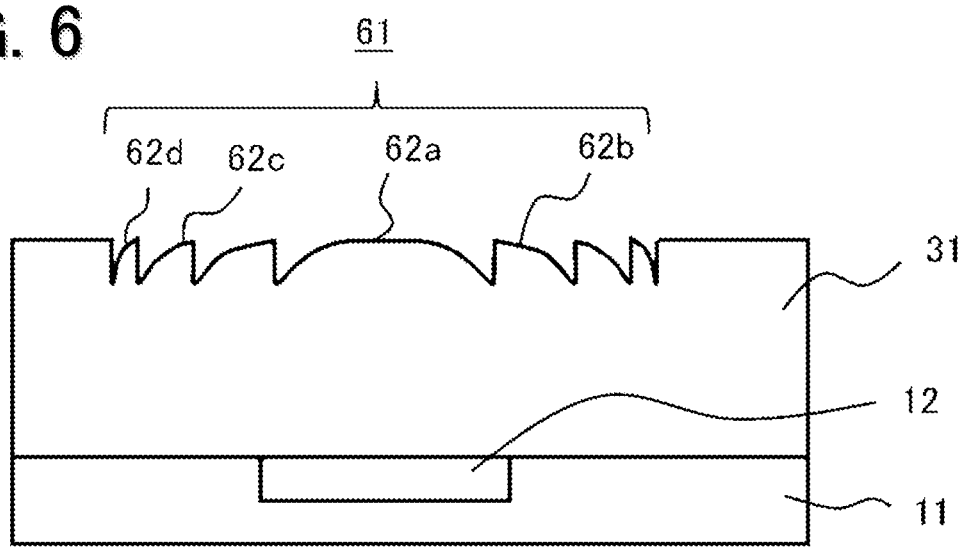
FIG. 6 is a diagram illustrating a wafer manufacturing step for the optical semiconductor device of FIG. 1.

After completion of the etching step of the interlayer film 31, the resist pattern 41 is removed, so that the Fresnel lens 61 provided with the convex portions 62a, 62b, 62c and 62d as shown in FIG. 6 is formed on the surface of the interlayer film 31. Examples of the top-view shape of the Fresnel lens 61 are shown in FIG. 8 to FIG. 10. The first example shown in FIG. 8 is a concentric circle shape, the second example shown in FIG. 9 is a square shape provided with curvatures at four corners, and the third example shown in FIG. FIG. 10 is a rectangle shape provided with curvatures at four corners. The top-view shapes of the first example to the third example are each provided as a concentric ring shape. Generally, the Fresnel lens 61 having a concentric circle shape is employed; however, the shape of the second example, the shape of the third example or another shape may be selected as the top-view shape of the Fresnel lens 61 according to the shape of the light receiving unit 12. The resist pattern 41 is formed so as to have fine widths of residual resist corresponding to the top-view shape of the Fresnel lens 61. The resist pattern 41 for forming each of the top-view shapes of FIG. 8 to FIG. 10, is formed so that a width of residual resist for forming the center convex portion 62a is wider than a width of residual resist for forming each of the other convex portions 62b, 62c and 62d, and the width of residual resist for forming each of the convex portions 62b, 62c and 62d becomes gradually narrower in that order.

Figure 7:
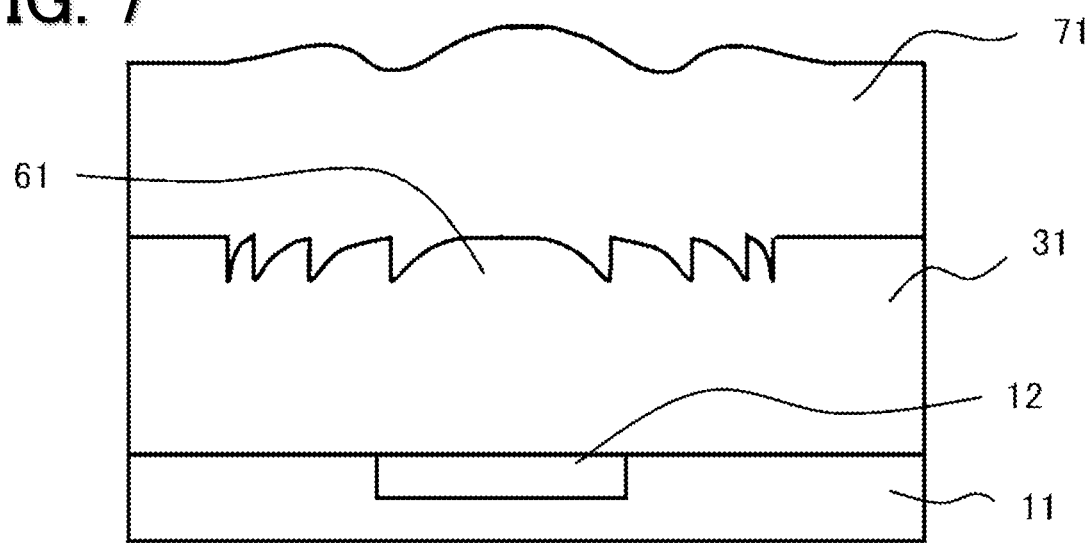
FIG. 7 is a diagram illustrating a wafer manufacturing step for the optical semiconductor device of FIG. 1.

After the Fresnel lens 61 was formed as shown in FIG. 6, in order to ensure resistance to humidity, as shown in FIG. 7, a protective film 71 that is a SiN film (silicon nitride film) having a refractive index larger than that of the interlayer film 31 as a SiO$_2$-based film and having a film thickness of 1.0 to 3.0 μm, is deposited by a CVD method or the like so as to cover the interlayer film 31 on which the Fresnel lens 61 is formed. On the surface of the protective film 71, an undulated shape appears due to the concave-convex shape of the underlying Fresnel lens 61. Since the protective film 71 covers the SiO$_2$-based film as silica glass, it may be referred to as a glass coating film. The protective film 71 having the undulated shape is planarized such that the surface thereof is polished by a CMP method until the film thickness reaches 0.5 to 1.0 μm. The optical semiconductor device 50 after the protective film 71 was planarized and the wafer manufacturing steps were completed is shown in FIG. 1. A protective film corresponding to the thus-planarized protective film 71 is indicated by numeral 81.

Operations and effects according to the optical semiconductor device 50 of Embodiment 1 will be described. According to the optical semiconductor device for receiving light shown in FIG. 1, which is an avalanche photodiode (APD) or the like, the optical signal 8a enters the planarized protective film 81 as a SiN film, so that the optical signal 8b converged by the Fresnel lens 61 formed on the interlayer film 31 as a SiO$_2$-based film under the protective film 81, is received by the light receiving unit 12. The refractive index of the protective film 81 is 1.9 and the refractive index of the interlayer film 31 is 1.4, so that the optical semiconductor device 50 of Embodiment 1 can converge optical signals at angles wider than those by a conventional APD using a single-layer SiO$_2$ lens. Further, according to the optical semiconductor device 50 of Embodiment 1, the light-receiving sensitivity of the light receiving unit 12 can be enhanced in such a manner that the focal length of the Fresnel lens 61 is adjusted in accordance with the wavelength of the optical signal 8a, 8b, on the basis of the film thickness of the interlayer film 31, the intervals between the concentric circles in the pattern of the Fresnel lens 61 and the dry etching depth thereof. Further, in the optical semiconductor device 50 of Embodiment 1, the protective film 81 exists at the top thereof, so that sufficient resistance to humidity is ensured.

It is noted that the intervals between the concentric circles in the pattern of the Fresnel lens 61 correspond to the widths of the convex portions 62b, 62c and 62d. Description will be made using the top-view shape of the Fresnel lens 61 shown in FIG. 8. A circle at the center portion (1st circle) is an outer circumferential circle of the convex portion 62a (inner circumferential circle of the convex portion 62b), a circle on the outside thereof (2nd circle) is an outer circumferential circle of the convex portion 62b (inner circumferential circle of the convex portion 62c), a third circle on the outside thereof (3rd circle) is an outer circumferential circle of the convex portion 62c (inner circumferential circle of the convex portion 62d), and a fourth circle provided as the outermost circumference (4th circle) is an outer circumferential circle of the convex portion 62d. The interval between the 1st circle and the 2nd circle in the pattern of the Fresnel lens 61 in FIG. 8 corresponds to the width of the convex portion 62b. Likewise, in the pattern of the Fresnel lens 61 in FIG. 8, the interval between the 2nd circle and the 3rd circle corresponds to the width of the convex portion 62c, and the interval between the 3rd circle and the 4th circle corresponds to the width of the convex portion 62d.

Unlike the conventional APD for which it is required to assemble an optical semiconductor device for receiving light and an independent lens with an independent package, according to the optical semiconductor device 50 of Embodiment 1, the Fresnel lens 61 is formed in the wafer manufacturing steps for the optical semiconductor device for receiving light. Thus, it is possible to make the number of components thereof less than that of the conventional device, and thus to achieve downsizing. Further, according to the optical semiconductor device 50 of Embodiment 1, since the Fresnel lens 61 is formed in the wafer manufacturing steps for the semiconductor device for receiving light, it is possible to eliminate such a step of assembling an independent lens with an independent package, and thus to reduce the number of manufacturing steps thereof. According to the optical semiconductor 50 of Embodiment 1, since the number of the components and the number of the manufacturing steps are reduced, it becomes possible to achieve cost reduction. Furthermore, according to the optical semiconductor device 50 of Embodiment 1, since the light-receiving sensitivity is enhanced, it becomes possible also to achieve reduction in power consumption.

As described above, the optical semiconductor device 50 of Embodiment 1 comprises: the semiconductor substrate 11; an optical communication unit that is provided on the semiconductor substrate 11 as the light receiving unit 12 for receiving the optical signal 8a, 8b; the interlayer film 31 that covers the semiconductor substrate 11 and the optical communication unit; the Fresnel lens 61 through which the optical signal 8a, 8b passes, that is provided on the planarized surface of the interlayer film 31 placed on its side farther from the semiconductor substrate 11; and the protective film 81 that covers the Fresnel lens 61 and the interlayer film 31, whose refractive index is larger than that of the interlayer film 31, and whose surface placed on its side farther from the interlayer film 31 is planarized. According to the optical semiconductor device 50 of Embodiment 1, since the Fresnel lens 61 through which the optical signal 8a, 8b passes is provided on the planarized surface of the interlayer film 31 that covers the optical communication unit for receiving (or emitting) the optical signal 8a, 8b, and the planarized protective film 81 covers the Fresnel lens 61 and the interlayer film 31, it is possible to reduce the number of the components and the number of the manufacturing steps, and to achieve downsizing.

Embodiment 2

Figure 11:
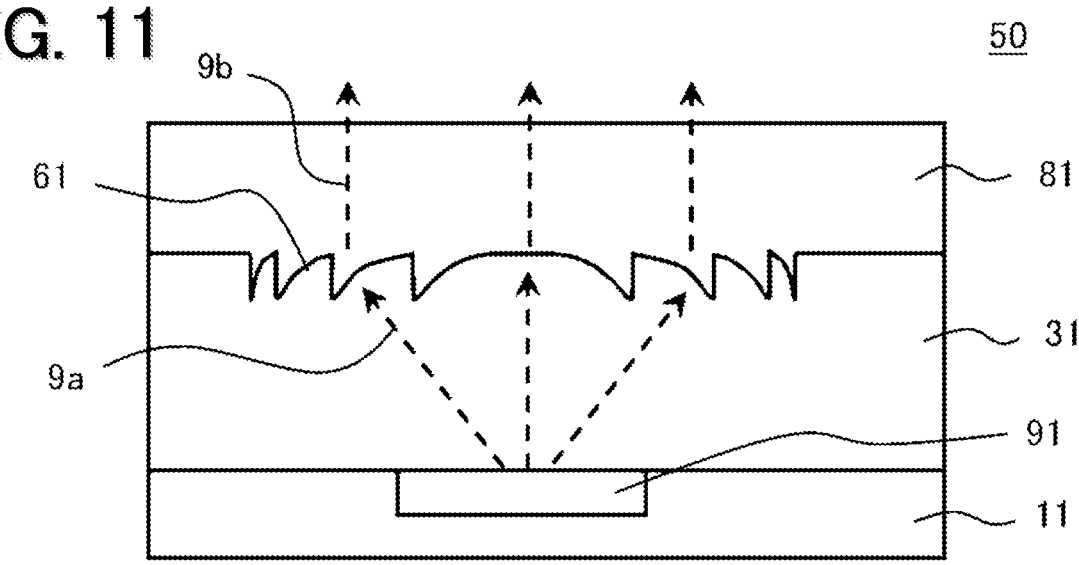
FIG. 11 is a schematic diagram showing a cross-sectional structure of an optical semiconductor device according to Embodiment 2 of the invention.

FIG. 11 is a schematic diagram showing a cross-sectional structure of an optical semiconductor device according to Embodiment 2 of the invention. An optical semiconductor device 50 of Embodiment 2 is an example of a semiconductor device for emitting light, such as, a laser diode, a light-emitting diode or the like. An optical semiconductor device 50 of Embodiment 2 includes: a semiconductor substrate 11; a light emitting unit 91 that is provided on the semiconductor substrate 11, for emitting an optical signal 9a, 9b; an interlayer film 31 as a $SiO_2$-based film; a Fresnel lens 61 provided on a surface of the interlayer film 31; and a protective film 81 as a SiN film that covers the Fresnel lens 61. The light emitting unit is a transmitter unit having a transmitting function in an optical communication unit for establishing optical signal communication. The optical semiconductor device 50 of Embodiment 2 differs from the optical semiconductor device 50 of Embodiment 1 in that the light emitting unit 91, instead of the light receiving unit 12, is formed on the semiconductor substrate 11. The wafer manufacturing steps for the optical semiconductor device 50 of Embodiment 2 are similar to those in Embodiment 1. Note that, in the manufacturing step of a substrate before lens formation, the light emitting unit 91 is formed on the substrate 11. The semiconductor substrate 11 on which the light emitting unit 91 is formed is the substrate before lens formation.

Operations and effects according to the optical semiconductor device 50 of Embodiment 2 will be described. According to the optical semiconductor device for emitting light shown in FIG. 11 which is a laser diode, a light-emitting diode or the like, the optical signal 9a emitted from the light emitting unit 91 is refracted by the Fresnel lens 61 formed on the interlayer film 31 as a $SiO_2$-based film to thereby pass through the protective film 81 as a SiN film formed on that lens, to be radiated outward. The refractive index of the protective film 81 is 1.9 and thus, the refractive index of the protective film 81 is larger than the refractive index of 1.4 of the interlayer film 31, so that, at the boundary between the interlayer film 31 and the protective film 81, the optical signal is further refracted to the center side. This prevents the optical signal 9a, 9b from being dispersed and diminished.

Unlike the conventional optical semiconductor device for which it is required to assemble a semiconductor device for emitting light and an independent lens with an independent package, according to the optical semiconductor device 50 of Embodiment 2, the Fresnel lens 61 is formed in the wafer manufacturing steps for the optical semiconductor device for emitting light. Thus, it is possible to make the number of components thereof less than that of the conventional device, and thus to achieve downsizing. Further, according to the optical semiconductor device 50 of Embodiment 2, since the Fresnel lens 61 is formed in the wafer manufacturing steps for the semiconductor device for emitting light, it is possible to eliminate such a step of assembling an independent lens with an independent package, and thus to reduce the number of manufacturing steps thereof. According to the optical semiconductor 50 of Embodiment 2, since the number of the components and the number of the manufacturing steps are reduced, it becomes possible to achieve cost reduction. Furthermore, according to the optical semiconductor device 50 of Embodiment 2, since the optical signal 9a, 9b is prevented from being dispersed and diminished, it becomes possible also to achieve reduction in power consumption.

As described above, the optical semiconductor device 50 of Embodiment 2 comprises: the semiconductor substrate 11; an optical communication unit that is provided on the semiconductor substrate 11 as the light emitting unit 91 for emitting the optical signal 9a, 9b; the interlayer film 31 that covers the semiconductor substrate 11 and the optical communication unit; the Fresnel lens 61 through which the optical signal 9a, 9b passes, that is provided on the planarized surface of the interlayer film 31 placed on its side farther from the semiconductor substrate 11; and the protective film 81 that covers the Fresnel lens 61 and the interlayer film 31, whose refractive index is larger than that of the interlayer film 31, and whose surface placed on its side farther from the interlayer film 31 is planarized. According to the optical semiconductor device 50 of Embodiment 2, since the Fresnel lens 61 through which the optical signal 9a, 9b passes is provided on the planarized surface of the interlayer film 31 that covers the optical communication unit for emitting the optical signal 9a, 9b, and the planarized protective film 81 covers the Fresnel lens 61 and the interlayer film 31, it is possible to reduce the number of the components and the number of the manufacturing steps, and to achieve downsizing.

Embodiment 3

Figure 12:
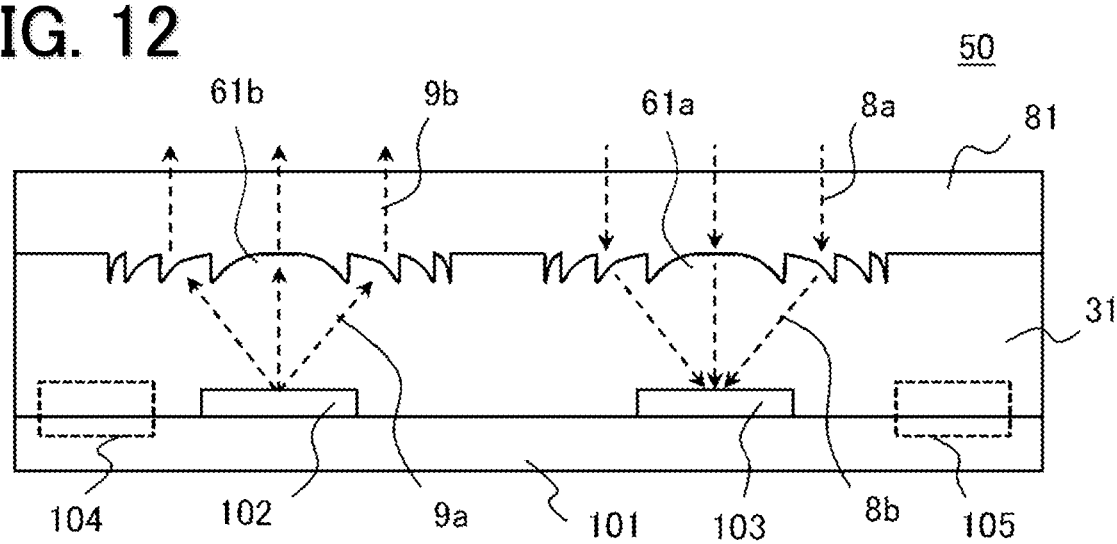
FIG. 12 is a schematic diagram showing a cross-sectional structure of an optical semiconductor device according to Embodiment 3 of the invention.

FIG. 12 is a schematic diagram showing a cross-sectional structure of an optical semiconductor device according to Embodiment 3 of the invention. An optical semiconductor device 50 of Embodiment 3 is an example of a highly-functional optical semiconductor device, such as an optical sensor or the like that includes an integrated circuit, a light emitting unit and a light receiving unit. The optical semiconductor device 50 of Embodiment 3 includes: a semiconductor substrate 101 on which an integrated circuit 104 such as a signal processing circuit or the like and an integrated circuit 105 such as a power circuit or the like, are formed; a light emitting unit 102 provided (formed or mounted) on the semiconductor substrate 101, for emitting an optical signal 9a, 9b; a light receiving unit 103 provided (formed or mounted) on the semiconductor substrate 101, for receiving an optical signal 8a, 8b; an interlayer film 31 as a $SiO_2$-based film; Fresnel lenses 61a, 61b provided on a surface of the interlayer film 31; and a protective film 81 as a SiN film that covers the Fresnel lenses 61a, 61b. The light emitting unit 102 is a planar light-emitting structural unit, such as a laser diode, a light-emitting diode or the like. The light receiving unit 103 is a planar light-receiving structural unit, such as an avalanche photodiode (APD) or the like. The Fresnel lens 61a is a Fresnel lens for receiving light that is formed above the light receiving unit 103, namely, on the surface of the interlayer film 31 (its surface on the side opposite to the side facing the semiconductor substrate 101). The Fresnel lens 61b is a Fresnel lens for radiating light that is formed above the light emitting unit 102, namely, on the surface of the interlayer film 31 (its surface on the side opposite to the side facing the semiconductor substrate 101). For the Fresnel lenses, numeral 61 is used collectively, and numerals 61a, 61b are used when they are to be described distinctively. The integrated circuit 104 performs signal processing after converting the optical signal 8a, 8b received by the light receiving unit 103 into an electrical signal, and generates an electrical signal serving as a basis for the optical signal 9a, 9b to be emitted by the light emitting unit 102.

The optical semiconductor device 50 of Embodiment 3 differs from the optical semiconductor device 50 of Embodiment 1 in that the light emitting unit 102 and the integrated circuits 104, 105, in addition to the light receiving unit 103, are formed on the semiconductor substrate 101. In the wafer manufacturing steps for the optical semiconductor device 50 of Embodiment 3, the steps of forming the planarized interlayer film 31, the Fresnel lens 61 and the planarized protective film 81 are the same as those in Embodiment 1. In the manufacturing step of a substrate before lens formation, the integrated circuits 104, 105 are formed on the semiconductor substrate 101, and thereafter, the light emitting unit 102 and the light receiving unit 103 are formed or mounted on the semiconductor substrate 101. The semiconductor substrate 101 on which the integrated circuits 104, 105 are formed and the light emitting unit 102 and the light receiving unit 103 are formed or mounted is the substrate before lens formation. In the case of mounting the light emitting unit 102 and the light receiving unit 103 on the semiconductor substrate 101, the planar light-emitting structural unit and the planar light-receiving structural unit each formed into a chip shape are mounted on the semiconductor substrate 101. Note that, in FIG. 12, the integrated circuits 104, 105 are formed, for example, on the under side of the paper, so that they are indicated by broken-line frames.

Operations and effects according to the optical semiconductor device 50 of Embodiment 3 will be described. The optical signal 9a emitted from the light emitting unit 102 shown in FIG. 12 which is a planar light-emitting structural unit such as a laser diode, a light-emitting diode or the like, is refracted by the Fresnel lens 61b formed on the interlayer film 31 as a $SiO_2$-based film, to thereby pass through the protective film 81 as a SiN film formed on that lens, to be radiated outward. The refractive index of the protective film 81 is 1.9 and thus, the refractive index of the protective film 81 is larger than the refractive index of 1.4 of the interlayer film 31, so that, at the boundary between the interlayer film 31 and the protective film 81, the optical signal is further refracted to the center side. This prevents the optical signal 9a, 9b from being dispersed and diminished.

The optical signal 9b emitted from the light emitting unit 102 hits an object such as an obstacle, a door or the like, and is then reflected off it. The thus-reflected optical signal is incident as the optical signal 8a on the optical semiconductor device 50. The optical signal 8a enters the planarized protective film 81 as a SiN film, so that the optical signal 8b converged by the Fresnel lens 61a formed on the interlayer film 31 as a $SiO_2$-based film under the protective film 81, is received by the light receiving unit 103 as a planar light-receiving structural unit such as an avalanche photodiode (APD) or the like, formed or mounted on the semiconductor substrate 101. The refractive index of the protective film 81 is 1.9 and the refractive index of the interlayer film 31 is 1.4, so that the optical semiconductor device 50 of Embodiment 3 can converge optical signals at angles wider than those by a conventional APD using a single-layer $SiO_2$ lens, to thereby enhance the light-receiving sensitivity of the light receiving unit 103. Accordingly, even if the optical signal 8a, 8b is weak, the optical semiconductor device 50 of Embodiment 3 can detect that signal.

The received optical signal 8b is subjected to analog or digital-signal processing by the integrated circuit 104 such as a signal processing circuit or the like, formed on the semiconductor substrate 101, so that the presence, the distance and the position of the object are determined through calculation by the integrated circuit 104 and then, information of the presence, the distance and the position of the object is transmitted to another control system on the outside of the optical semiconductor device 50. Meanwhile, in accordance with the wavelength of the optical signal 8a, 8b, 9a, 9b, the focal lengths of the Fresnel lenses 61a, 61b are adjusted on the basis of the film thickness of the interlayer film 31 as a $SiO_2$-based film, the intervals between the concentric circles in the pattern of each of the Fresnel lenses 61a, 61b and the dry etching depth thereof. Further, in the optical semiconductor device 50 of Embodiment 3, the protective film 81 exists at the top thereof, so that sufficient resistance to humidity is ensured.

Unlike the conventional optical semiconductor device which is required to have a module configuration in which a semiconductor device including a planar light-emitting element and a planar light-receiving element, and an independent lens are assembled with an independent package, according to the optical semiconductor device 50 of Embodiment 3, on the common semiconductor substrate 101, the light emitting unit 102 and the light receiving unit 103 are formed or mounted and further the integrated circuits 104, 105 are formed, and the Fresnel lens 61 is formed in the wafer manufacturing steps for the optical semiconductor device. Thus, it is possible to make the number of components thereof less than that of the conventional device, and thus to achieve downsizing. According to the optical semiconductor device 50 of Embodiment 3, since the Fresnel lens 61 is formed in the wafer manufacturing steps for the optical semiconductor device, it is possible to eliminate such a step of assembling an independent lens with an independent package, and thus to reduce the number of manufacturing steps thereof, to thereby simplify the manufacturing steps. According to the optical semiconductor 50 of Embodiment 3, since the number of the components and the number of the manufacturing steps are reduced, it becomes possible to achieve cost reduction. The optical semiconductor device 50 of Embodiment 3, even if the optical signal 8a, 8b is weak, can detect that signal, and the light-receiving sensitivity of the light receiving unit 103 is enhanced. Thus, it becomes possible also to achieve reduction in power consumption. With such a configuration of the optical semiconductor device 50 of Embodiment 3, as compared with the conventional device, the manufacturing steps are simplified and it becomes possible to achieve downsizing and cost reduction, and furthermore, since the optical signal 9a, 9b emitted from the light emitting unit 102 is prevented from being dispersed and diminished, it is possible to achieve a highly-functional optical semiconductor device, such as an optical sensor or the like, which can achieve enhancement in the sensitivity and reduction in power consumption.

Embodiment 4

Figure 13:
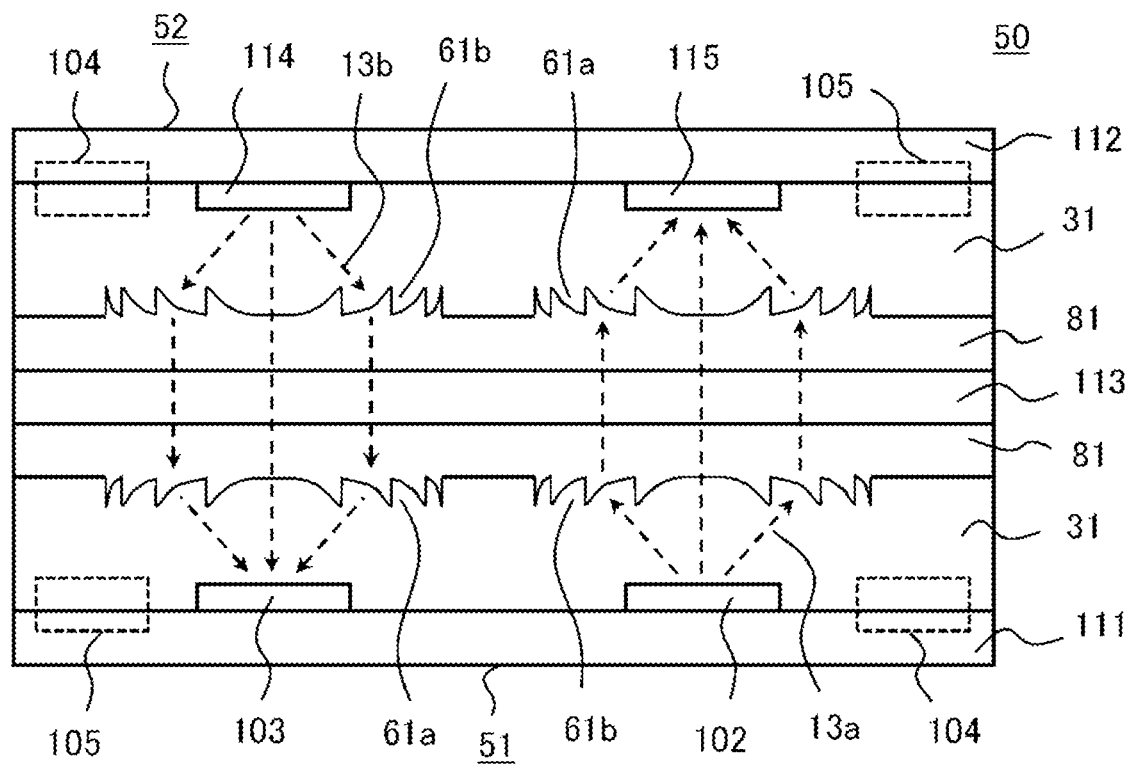
FIG. 13 is a schematic diagram showing a cross-sectional structure of an optical semiconductor device according to Embodiment 4 of the invention.

FIG. 13 is a schematic diagram showing a cross-sectional structure of an optical semiconductor device according to Embodiment 4 of the invention. An optical semiconductor device 50 of Embodiment 4 is an example of an optical semiconductor device provided with two highly-functional optical semiconductor devices of Embodiment 3 each including the integrated circuits, the light emitting unit and the light receiving unit, and in which mutual transmission/reception (communication) of optical signals between these devices is established using the respective light emitting units and the respective light receiving units. The optical semiconductor device 50 of Embodiment 4 is an optical semiconductor device which includes two light transceivers 51, 52 and in which the light transceivers 51, 52 are bonded together using an interlayer film 113 made of an organic or inorganic material. The light transceiver 51 includes: a semiconductor substrate 111 on which an integrated circuit 104 such as a signal processing circuit or the like and an integrated circuit 105 such as a power circuit or the like are formed; a light emitting unit 102 provided (formed or mounted) on the semiconductor substrate 111, for emitting an optical signal 13*a*; a light receiving unit 103 provided (formed or mounted) on the semiconductor substrate 111, for receiving an optical signal 13*b*; an interlayer film 31 as a $SiO_2$-based film; Fresnel lenses 61*a*, 61*b* provided on a surface of the interlayer film 31; and a protective film 81 as a SiN film that covers the Fresnel lenses 61*a*, 61*b*. Like in Embodiment 3, the light emitting unit 102 is a planar light-emitting structural unit, such as a laser diode, a light-emitting diode or the like. Like in Embodiment 3, the light receiving unit 103 is a planar light-receiving structural unit, such as an avalanche photodiode (APD) or the like. The Fresnel lens 61*a* of the light transceiver 51 is a Fresnel lens for receiving light that is formed in a distant region apart from the light receiving unit 103 in a direction perpendicular thereto, namely, on the surface of the interlayer film 31 (its surface on the side opposite to the side facing the semiconductor substrate 111). The Fresnel lens 61*b* of the light transceiver 51 is a Fresnel lens for radiating light that is formed in a distant region apart from the light emitting unit 102 in a direction perpendicular thereto, namely, on the surface of the interlayer film 31 (its surface on the side opposite to the side facing the semiconductor substrate 111).

The light transceiver 52 includes: a semiconductor substrate 112 on which an integrated circuit 104 such as a signal processing circuit or the like and an integrated circuit 105 such as a power circuit or the like are formed; a light emitting unit 114 provided (formed or mounted) on the semiconductor substrate 112, for emitting the optical signal 13*b*; a light receiving unit 115 provided (formed or mounted) on the semiconductor substrate 112, for receiving the optical signal 13*a*; an interlayer film 31 as a $SiO_2$-based film; Fresnel lenses 61*a*, 61*b* provided on a surface of the interlayer film 31; and a protective film 81 as a SiN film that covers the Fresnel lenses 61*a*, 61*b*. Like in Embodiment 3, the light emitting unit 114 is a planar light-emitting structural unit, such as a laser diode, a light-emitting diode or the like. Like in Embodiment 3, the light receiving unit 115 is a planar light-receiving structural unit, such as an avalanche photodiode (APD) or the like. The light emitting unit 114 and the light receiving unit 115 of the light transceiver 52 are placed so as to face the light receiving unit 103 and the light emitting unit 102 of the light transceiver 51, respectively. The Fresnel lens 61*a* of the light transceiver 52 is a Fresnel lens for receiving light that is formed in a distant region apart from the light receiving unit 115 in a direction perpendicular thereto, namely, on the surface of the interlayer film 31 (its surface on the side opposite to the side facing the semiconductor substrate 112). The Fresnel lens 61*b* of the light transceiver 52 is a Fresnel lens for radiating light that is formed in a distant region apart from the light emitting unit 114 in a direction perpendicular thereto, namely, on the surface of the interlayer film 31 (its surface on the side opposite to the side facing the semiconductor substrate 112).

Figure 14:
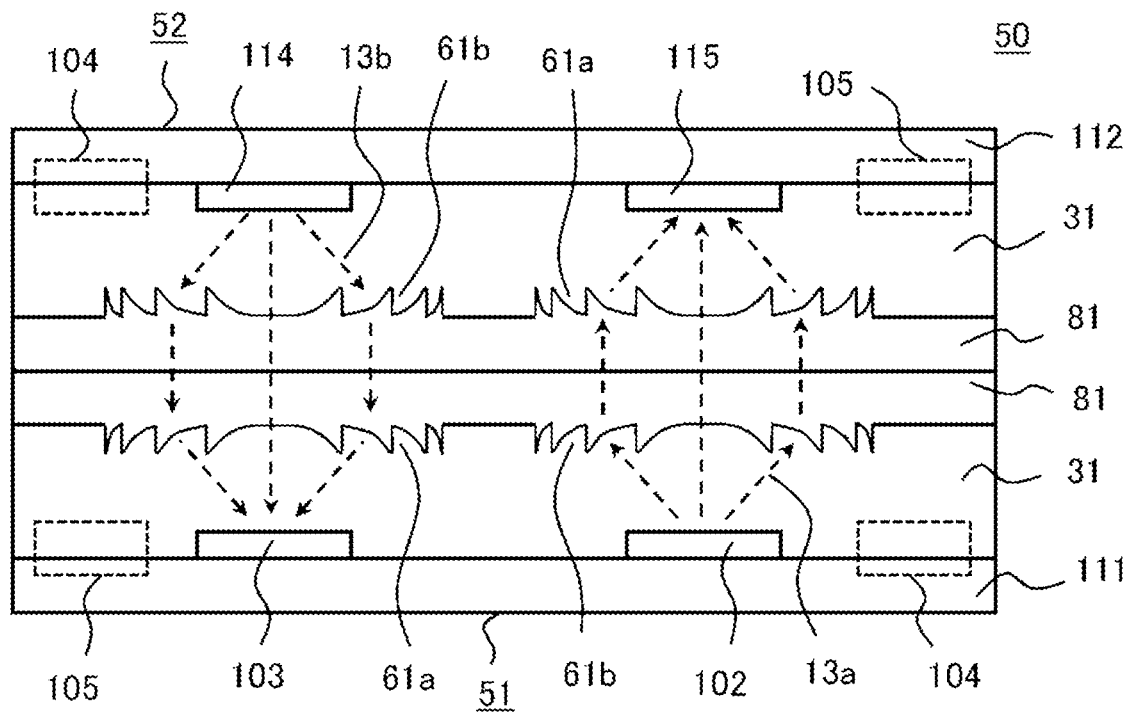
FIG. 14 is a schematic diagram showing a cross-sectional structure of another optical semiconductor device according to Embodiment 4 of the invention.

In FIG. 13, an example of the optical semiconductor 50 is shown in which two light transceivers 51, 52 are bonded together using the interlayer film 113 made of an organic or inorganic material. However, since the surfaces of the respective light receivers 51, 52, that are farthest apart from the semiconductor substrates 111, 112 in directions perpendicular thereto, are provided by the planarized protective films 81, it is allowable, as shown in FIG. 14, to directly bond the light transceiver 51 and the light transceiver 52 together using a van der Waals force by tightly contacting them. FIG. 14 is a schematic diagram showing a cross-sectional structure of another optical semiconductor device according to Embodiment 4 of the invention. The other optical semiconductor device 50 shown in FIG. 14 differs from the optical semiconductor device 50 shown in FIG. 13 in that the interlayer film 113 is not provided and the light transceiver 51 and the light transceiver 52 are directly bonded together using a van der Waals force in a tightly contacted state.

Operations and effects according to the optical semiconductor device 50 of Embodiment 4 will be described. The optical signal 13*a* emitted from the light emitting unit 102 shown in FIG. 13 which is a planar light-emitting structural unit such as a laser diode, a light-emitting diode or the like, is refracted by the Fresnel lens 61*b* formed on the interlayer film 31 as a $SiO_2$-based film, to thereby pass through the protective film 81 as a SiN film formed in a distant region in the traveling direction of that signal. The refractive index of the protective film 81 is 1.9 and thus, the refractive index of the protective film 81 is larger than the refractive index of 1.4 of the interlayer film 31, so that, at the boundary between the interlayer film 31 and the protective film 81, the optical signal is further refracted to the center side. This prevents the optical signal 13*a* from being dispersed and diminished.

The optical signal 13*a* emitted from the light emitting unit 102 passes through the interlayer film 113 made of an organic or inorganic material, and is then received by the light receiving unit 115 as a planar light-receiving structural unit such as an avalanche photodiode (APD) or the like, formed or mounted on the semiconductor substrate 112 of the light transceiver 52. The optical signal 13*a* incident on the light transceiver 52 firstly enters the planarized protective film 81 as a SiN film, and is then converged by the Fresnel lens 61*a* formed on the interlayer film 31 as a $SiO_2$-based film that is placed on the semiconductor substrate 112-side as viewed from the protective film 81, and received by the light receiving unit 115. The refractive index of the protective film 81 is 1.9 and the refractive index of the interlayer film 31 is 1.4, so that the light receiving unit 115 of the light transceiver 52 can converge optical signals at angles wider than those by a conventional APD using a single-layer $SiO_2$ lens, to thereby enhance the light-receiving sensitivity of the light receiving unit 115. Accordingly, even if the optical signal 13*a* is weak, the light receiving unit 115 of the light transceiver 52 can detect that signal.

The optical signal 13*a* received by the light receiving unit 115 of the light transceiver 52 is subjected to analog or digital-signal processing by the integrated circuit 104 such as a signal processing circuit or the like, formed on the semiconductor substrate 112, and the processed signal is transmitted as the optical signal 13*b* from the light emitting unit 114. The optical signal 13*b* emitted from the light emitting unit 114 of the light transceiver 52 passes in a direction opposite to that of the optical signal 13*a*, through the Fresnel lens 61*b* formed on the interlayer film 31 as a $SiO_2$-based film, the protective film 81 as a SiN film and the interlayer film 113 made of an organic or inorganic material, and is converged by the Fresnel lens 61*a* formed on the protective film 81 as a SiN film and the interlayer film 31 as a $SiO_2$-based film in the light transceiver 51, and is then accepted by the light receiving unit 103.

According to the optical semiconductor device 50 of Embodiment 4, since optical communication between two light transceivers 51, 52 is established through a shortest path, it is possible to reduce to a minimum the output power of each of the optical signals 13a, 13b. Meanwhile, in the optical semiconductor device 50 of Embodiment 4, in accordance with the wavelengths of the optical signals 13a, 13b and the path, the focal lengths of the Fresnel lenses 61a, 61b are each adjusted optimally by adjustment of the film thickness of the interlayer film 31 as a $SiO_2$-based film, the intervals between the concentric circles in the pattern of each of the Fresnel lenses 61a, 61b and/or the dry etching depth thereof. Further, in the optical semiconductor device 50 of Embodiment 4, the respective protective films 81 exist in respective distant regions apart from the semiconductor substrates 111, 112 of the light transceivers 51, 52 in directions perpendicular thereto, namely, on the surfaces of the respective interlayer films 31 (their surfaces on the sides opposite to the sides facing the semiconductor substrates 111, 112), so that sufficient resistance to humidity is ensured.

As described previously, in semiconductor integrated circuits, it is usual that signal processing is associated with signal transmission between functional circuits by use of aluminum or like metal wiring. Even in the case of a conventional optical semiconductor device as a light-handling semiconductor device, communication between the conventional optical semiconductor device in which a semiconductor integrated circuit is formed and another semiconductor device which may be an optical semiconductor device, is established based on an electrical signal also using the metal wiring. According to the electrical signal-based communication using the metal wiring, there is a problem of heat generation and limited communication speed. Thus, for the optical semiconductor device that makes communication by an optical signal, it is required to reduce the heat generation and to increase the communication speed. When optical communication is to be established between the optical semiconductor devices, such a problem arises that the number of components increases because of a light waveguide, an optical fiber and the like, and the planar area therefor increases.

In contrast, according to the optical semiconductor device 50 of Embodiment 4, since two semiconductor devices, for example, the light transceivers 51, 52, are bonded together and optical signals are used for their mutual communication, it becomes possible to reduce the number of components and to decrease the area, significantly. In the light transceivers 51, 52, the respective Fresnel lenses 61a, 61b were each formed by a wafer manufacturing process (in the wafer manufacturing steps) on a far side that corresponds to each of the light emitting units 102, 114 for transmitting the optical signals and the light receiving units 103, 115 for accepting the optical signals, and that is apart from each of the semiconductor substrates 111, 112 in a direction perpendicular thereto. This makes it possible for each of the light transceivers 51, 52 as optical semiconductor devices, to achieve downsizing, reduction in power consumption and cost reduction. Furthermore, this also makes it possible for the optical semiconductor device 50 of Embodiment 4 in which two semiconductor devices, for example, the light transceivers 51, 52, are bonded together, to achieve downsizing, reduction in power consumption and cost reduction.

According to the optical semiconductor device 50 of Embodiment 4, since it is provided with the light transceivers 51, 52 for establishing their mutual optical communication, and the light emitting unit 114 and the light receiving unit 115 of the light transceiver 52 are placed so as to face the light receiving unit 103 and the light emitting unit 102 of the light transceiver 51, respectively, it is possible to reduce the heat generation and to increase the communication speed, as compared with the conventional device. Further, according to the optical semiconductor device 50 of Embodiment 4, since each of the light transceivers 51, 52 includes the light emitting unit, the light receiving unit and the Fresnel lenses that are formed integrally in the wafer manufacturing steps, it is possible to reduce the number of components and the number of manufacturing steps of each of the light transceivers 51, 52, to thereby achieve downsizing and cost reduction of each of the light transceivers 51, 52 and further to achieve downsizing and cost reduction of the device as a whole.

Embodiment 5

Figure 15:
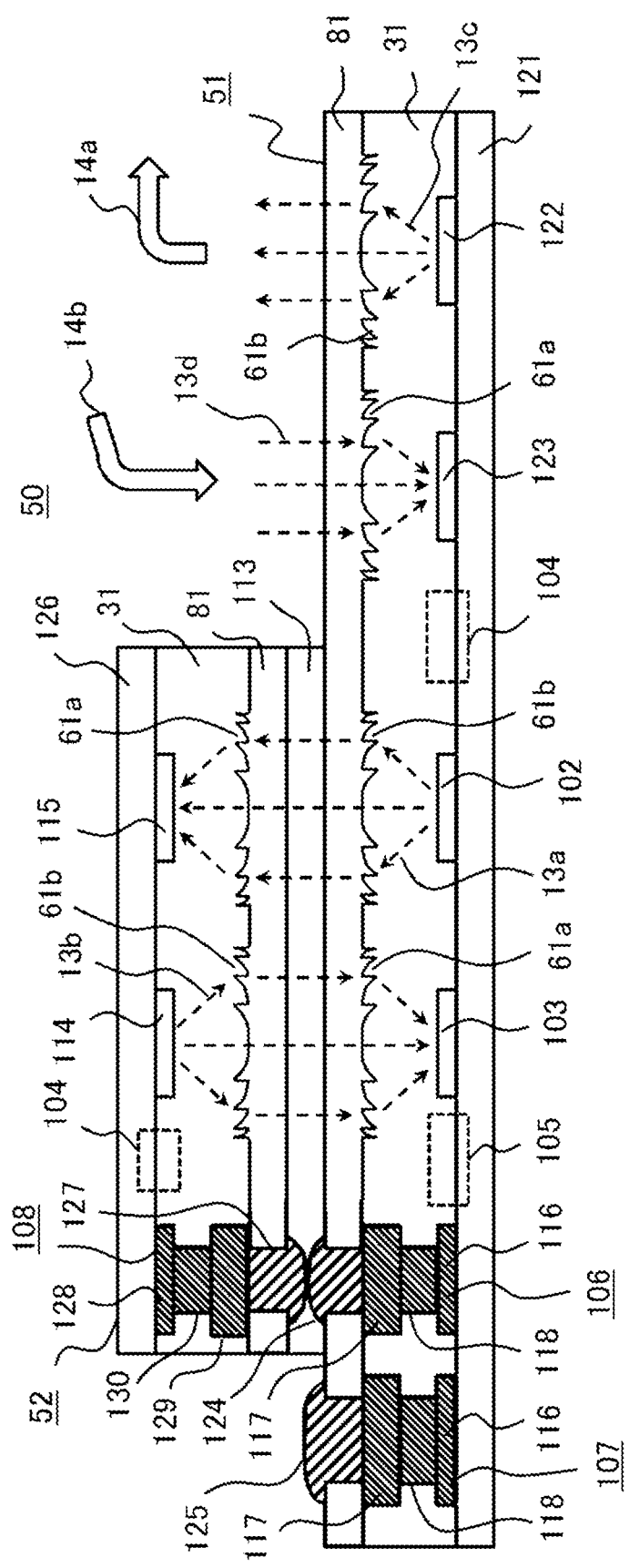
FIG. 15 is a schematic diagram showing a cross-sectional structure of an optical semiconductor device according to Embodiment 5 of the invention.

FIG. 15 is a schematic diagram showing a cross-sectional structure of an optical semiconductor device according to Embodiment 5 of the invention. An optical semiconductor device 50 of Embodiment 5 is an example of an optical semiconductor device provided with two highly-functional optical semiconductor devices each including integrated circuits, a light emitting unit and a light receiving unit, and in which mutual transmission/reception (communication) of optical signals between these devices is established using the respective light emitting units and the respective light receiving units. The optical semiconductor device 50 of Embodiment 5 is an optical semiconductor device provided with: a light transceiver 51 including, in addition to the integrated circuits, the light emitting unit and the light receiving unit, an electrical connection configuration for making electrical connection with an external system and an optical communication configuration (external system-related optical communication unit) for establishing optical communication with an external system; and a light transceiver 52 including, in addition to the integrated circuits, the light emitting unit and the light receiving unit, an electrical connection configuration directed to the light transceiver 51; and in which the light transceivers 51, 52 are bonded together using an interlayer film 113 made of an organic or inorganic material.

The light transceiver 51 includes: a semiconductor substrate 121 on which an integrated circuit 104 such as a signal processing circuit or the like and an integrated circuit 105 such as a power circuit or the like are formed; a light emitting unit 102 provided (formed or mounted) on the semiconductor substrate 121, for emitting an optical signal 13a; a light receiving unit 103 provided (formed or mounted) on the semiconductor substrate 121, for receiving an optical signal 13b; another light emitting unit 122 that is provided (formed or mounted) on the semiconductor substrate 121, for transmitting (emitting) an optical signal 13c from the light transceiver 51 to an external system; another light receiving unit 123 that is provided (formed or mounted) on the semiconductor substrate 121, for accepting (receiving) an optical signal 13d transmitted (emitted) from an external system to the light transceiver 51; an electrode unit 106 for making electrical connection with the light transceiver 52 facing the light transceiver 51; an electrode unit 107 for making electrical connection with an external system; an interlayer film 31 as a $SiO_2$-based film; respective Fresnel lenses 61a, 61b provided on a surface of the interlayer film 31; and a protective film 81 as a SiN film that covers the Fresnel lenses 61a, 61b. Like in Embodiment 3, the light emitting units 102, 122 are each a planar light-emitting structural unit, such as a laser diode, a light-emitting diode or the like. Like in Embodiment 3, the light receiving units 103, 123 are each a planar light-receiving structural unit, such as an avalanche photodiode (APD) or the like. The two Fresnel lenses 61a of the light transceiver 51 are Fresnel lenses for receiving light that are formed in distant regions apart from the light receiving units 103, 123 in directions perpendicular thereto, namely, on the surface of the interlayer film 31 (its surface on the side opposite to the side facing the semiconductor substrate 121). The two Fresnel lenses 61b of the light transceiver 51 are Fresnel lenses for radiating light that are formed in distant regions apart from the light emitting units 102, 122 in directions perpendicular thereto, namely, on the surface of the interlayer film 31 (its surface on the side opposite to the side facing the semiconductor substrate 121). The light emitting unit 122 is a transmitter unit having a transmitting function in an external system-related optical communication unit for establishing optical signal communication with an external system. The light receiving unit 123 is a receiver unit having a receiving function in the external system-related optical communication unit for establishing optical signal communication with an external system. The light emitting unit for establishing communication with an external system may be referred to as an external system-related light emitting unit, and the light receiving unit for establishing communication with an external system may be referred to as an external system-related light receiving unit.

The electrode unit 106 includes: a wired electrode 116 disposed on the semiconductor substrate 121; a wired electrode 117 disposed on the front-surface side of the interlayer film 31; connection metal 118 connecting the wired electrode 116 with the wired electrode 117; and a bump electrode 124 disposed so as to be connected to the wired electrode 117 and to be exposed out of the protective film 81. The electrode unit 107 has a structure similar to that of the electrode unit 106 and includes: a wired electrode 116 disposed on the semiconductor substrate 121; a wired electrode 117 disposed on the front-surface side of the interlayer film 31; connection metal 118 connecting the wired electrode 116 with the wired electrode 117; and a bump electrode 125 disposed so as to be connected to the wired electrode 117 and to be exposed out of the protective film 81. The electrode unit 106 is connected with an electrode unit 108 of the light transceiver 52, and is an electrode unit used for power supplying to the light transceiver 52 and for signal processing unrelated to optical communication with the light transceiver 52. The electrode unit 107 is an electrode unit used for power supplying between an external system and the light transceiver 51 and for signal processing. Note that, although an electrode unit used for power supplying and an electrode unit used for signal processing are separate electrode units, in FIG. 15, one electrode unit 106 and one electrode unit 107 are shown each as said electrode units.

The light transceiver 52 includes: a semiconductor substrate 126 on which an integrated circuit 104 such as a signal processing circuit or the like is formed; a light emitting unit 114 provided (formed or mounted) on the semiconductor substrate 126, for emitting the optical signal 13b; a light receiving unit 115 provided (formed or mounted) on the semiconductor substrate 126, for receiving the optical signal 13a; the electrode unit 108 for making electrical connection with the light transceiver 51 facing the light transceiver 52; an interlayer film 31 as a SiO$_2$-based film; Fresnel lenses 61a, 61b provided on a surface of the interlayer film 31; and a protective film 81 as a SiN film that covers the Fresnel lenses 61a, 61b. Like in Embodiment 3, the light emitting unit 114 is a planar light-emitting structural unit, such as a laser diode, a light-emitting diode or the like. Like in Embodiment 3, the light receiving unit 115 is a planar light-receiving structural unit, such as an avalanche photodiode (APD) or the like. The light emitting unit 114 and the light receiving unit 115 of the light transceiver 52 are placed so as to face the light receiving unit 103 and the light emitting unit 102 of the light transceiver 51, respectively. The Fresnel lens 61a of the light transceiver 52 is a Fresnel lens for receiving light that is formed in a distant region apart from the light receiving unit 115 in a direction perpendicular thereto, namely, on the surface of the interlayer film 31 (its surface on the side opposite to the side facing the semiconductor substrate 126). The Fresnel lens 61b of the light transceiver 52 is a Fresnel lens for radiating light that is formed in a distant region apart from the light emitting unit 114 in a direction perpendicular thereto, namely, on the surface of the interlayer film 31 (its surface on the side opposite to the side facing the semiconductor substrate 126).

The electrode unit 108 includes: a wired electrode 128 disposed on the semiconductor substrate 126; a wired electrode 129 disposed on the front-surface side of the interlayer film 31; connection metal 130 connecting the wired electrode 128 with the wired electrode 129; and a bump electrode 127 disposed so as to be connected to the wired electrode 129 and to be exposed out of the protective film 81. The electrode unit 108 is connected with the electrode unit 106 of the light transceiver 51, and is an electrode unit used for power supplying from the light transceiver 51 and used for signal processing unrelated to optical communication with the light transceiver 51. Note that, although an electrode unit used for power supplying and an electrode unit used for signal processing are separate electrode units, in FIG. 15, one electrode unit 108 is shown as said electrode units.

Figure 16:
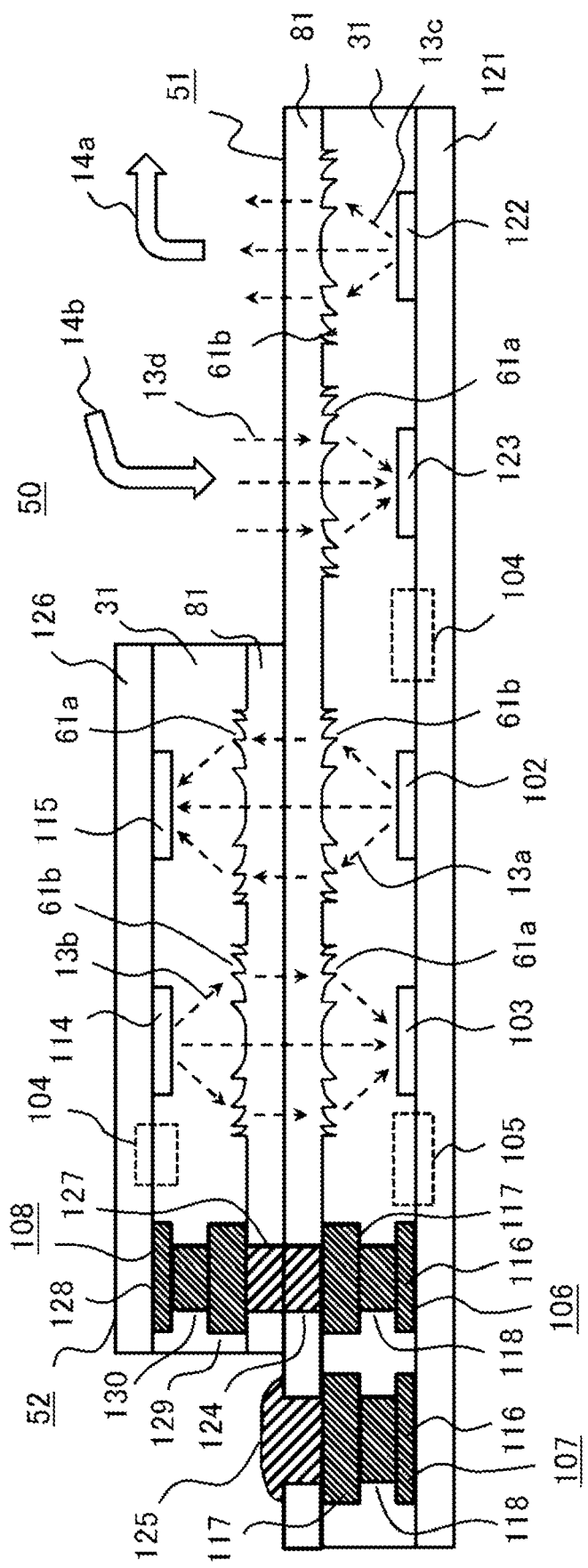
FIG. 16 is a schematic diagram showing a cross-sectional structure of another optical semiconductor device according to Embodiment 5 of the invention.

In FIG. 15, an example of the optical semiconductor 50 is shown in which two light transceivers 51, 52 are bonded together using the interlayer film 113 made of an organic or inorganic material. However, since the surfaces of the respective light receivers 51, 52, that are farthest apart from the semiconductor substrates 121, 126 in directions perpendicular thereto, are provided by the planarized protective films 81, it is allowable, as shown in FIG. 16, to directly bond the light transceiver 51 and the light transceiver 52 together using a van der Waals force by tightly contacting them. FIG. 16 is a schematic diagram showing a cross-sectional structure of another optical semiconductor device according to Embodiment 5 of the invention. The other optical semiconductor device 50 shown in FIG. 16 differs from the optical semiconductor device 50 shown in FIG. 15 in that the interlayer film 113 is not provided and the light transceiver 51 and the light transceiver 52 are directly bonded together using a van der Waals force in a tightly contacted state.

Operations and effects according to the optical semiconductor device 50 of Embodiment 5 will be described. The optical semiconductor device 50 of Embodiment 5 results from adding, to the optical semiconductor device 50 of Embodiment 4 in which optical communication is established between two light transceivers 51, 52, the electrical connection configuration for making electrical connection with an external system and the optical communication configuration (external system-related optical communication unit) for establishing optical communication with an external system. Like in the optical semiconductor device 50 of Embodiment 4, the optical signal 13a emitted from the light emitting unit 102 which is a planar light-emitting structural unit such as a laser diode, a light-emitting diode or the like, is refracted by the Fresnel lens 61b formed on the interlayer film 31 as a SiO$_2$-based film, to thereby pass through the protective film 81 as a SiN film formed in a distant region in the traveling direction of that signal. The refractive index of the protective film 81 is 1.9 and thus, the refractive index of the protective film 81 is larger than the refractive index of 1.4 of the interlayer film 31, so that, at the boundary between the interlayer film 31 and the protective film 81, the optical signal is further refracted to the center side. This prevents the optical signal 13a from being dispersed and diminished.

The optical signal 13a emitted from the light emitting unit 102 passes through the interlayer film 113 made of an organic or inorganic material, and is then received by the light receiving unit 115 as a planar light-receiving structural unit such as an avalanche photodiode (APD) or the like, formed or mounted on the semiconductor substrate 126 of the light transceiver 52. The optical signal 13a incident on the light transceiver 52 firstly enters the planarized protective film 81 as a SiN film, and is then converged by the Fresnel lens 61a formed on the interlayer film 31 as a SiO$_2$-based film that is placed on the semiconductor substrate 126-side as viewed from the protective film 81, and received by the light receiving unit 115. The refractive index of the protective film 81 is 1.9 and the refractive index of the interlayer film 31 is 1.4, so that the light receiving unit 115 of the light transceiver 52 can converge optical signals at angles wider than those by a conventional APD using a single-layer SiO$_2$ lens, to thereby enhance the light-receiving sensitivity of the light receiving unit 115. Accordingly, even if the optical signal 13a is weak, the light receiving unit 115 of the light transceiver 52 can detect that signal.

The optical signal 13a received by the light receiving unit 115 of the light transceiver 52 is subjected to analog or digital-signal processing by the integrated circuit 104 such as a signal processing circuit or the like, formed on the semiconductor substrate 126, and the processed signal is transmitted as the optical signal 13b from the light emitting unit 114. The optical signal 13b emitted from the light emitting unit 114 of the light transceiver 52 passes in a direction opposite to that of the optical signal 13a, through the Fresnel lens 61b formed on the interlayer film 31 as a SiO$_2$-based film, the protective film 81 as a SiN film and the interlayer film 113 made of an organic or inorganic material, and is converged by the Fresnel lens 61a formed on the protective film 81 as a SiN film and the interlayer film 31 as a SiO$_2$-based film in the light transceiver 51, and is then accepted by the light receiving unit 103.

According to the optical semiconductor device 50 of Embodiment 5, since optical communication between two light transceivers 51, 52 is established through a shortest path, it is possible to reduce to a minimum the output power of each of the optical signals 13a, 13b. Meanwhile, in the optical semiconductor device 50 of Embodiment 5, in accordance with the wavelengths of the optical signals 13a, 13b and the path, the focal lengths of the Fresnel lenses 61a, 61b are each adjusted optimally by adjustment of the film thickness of the interlayer film 31 as a SiO$_2$-based film, the intervals between the concentric circles in the pattern of each of the Fresnel lenses 61a, 61b and/or the dry etching depth thereof. Further, in the optical semiconductor device 50 of Embodiment 5, the respective protective films 81 exist in respective distant regions apart from the semiconductor substrates 121, 126 of the light transceivers 51, 52 in directions perpendicular thereto, namely, on the surfaces of the respective interlayer films 31 (their surfaces on the sides opposite to the sides facing the semiconductor substrates 121, 126), so that sufficient resistance to humidity is ensured.

The electrode unit 107 is formed in the light transceiver 51, so that power supplying from an external system and electrical-signal transmission to/from an external system are accomplished. The electrode unit 106 formed in the light transceiver 51 is connected to the electrode unit 108 formed in the light transceiver 52. A power supply-voltage and a power-supply current are supplied from the electrode unit 106 as an electrode for power supplying, to the light transceiver 52 through the electrode unit 108. Between the electrode unit 106 as an electrode for electrical-signal transmission and the electrode unit 107 as an electrode for electrical-signal transmission, a signal unrelated to optical communication is transmitted.

According to the optical semiconductor device 50 of Embodiment 5, from the light emitting unit 122 formed or mounted on the semiconductor substrate 121 of the light transceiver 51, the optical signal 13c is transmitted toward an external system, for example, in the direction indicated by an arrow 14a, while the optical signal 13d from the external system, for example, from the direction indicated by an arrow 14b, is accepted by the light receiving unit 123 formed or mounted on the semiconductor substrate 121 of the light transceiver 51. In this manner, according to the optical semiconductor device 50 of Embodiment 5, it is also possible to establish optical communication with the external system.

In addition to having effects same as those by the optical semiconductor device 50 of Embodiment 4, the optical semiconductor device 50 of Embodiment 5 can establish communication with an external system(s) using an electrical signal and an optical signal. Since the optical semiconductor device 50 of Embodiment 5 can establish communication with an external system(s) using an electrical signal and an optical signal, even though it is significantly smaller than a conventional optical module in which an optical semiconductor device handling many optical signals, a semiconductor device without handling any optical signal and other components are modularized, it can adapt to enlargement in volume of transmitted information and speed-up of communication speed. Further, since the optical semiconductor device 50 of Embodiment 5 can, even though it is small, adapt to enlargement in volume of transmitted information and speed-up of communication speed, it is possible for the external system to achieve downsizing, reduction in power consumption and cost reduction, accordingly.

Embodiment 6

Figure 17:
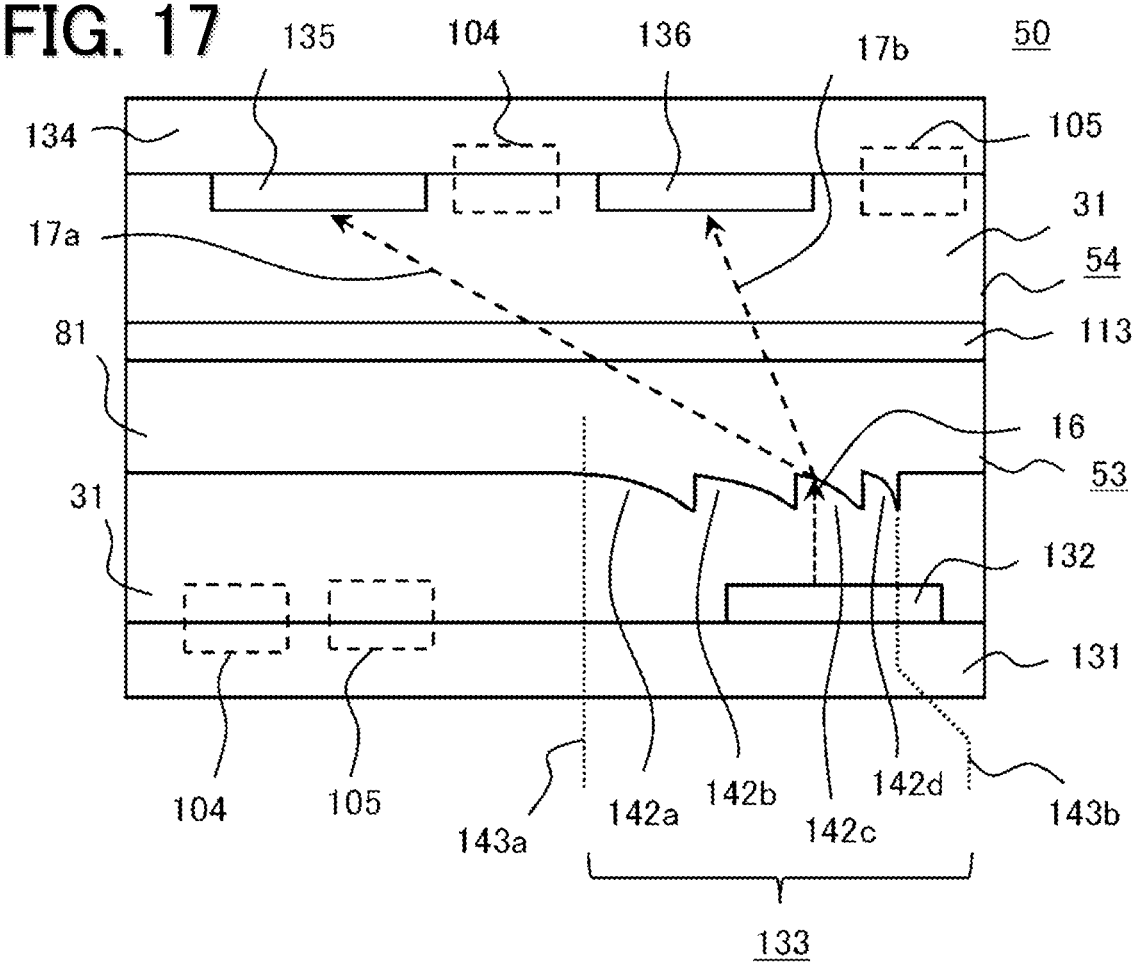
FIG. 17 is a schematic diagram showing a cross-sectional structure of an optical semiconductor device according to Embodiment 6 of the invention.
Figure 18:
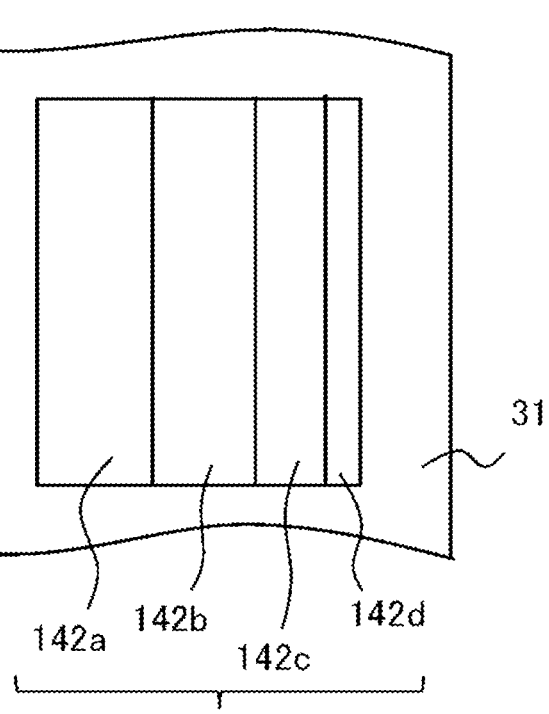
FIG. 18 is a diagram showing a top-view shape of a one-sided Fresnel lens in FIG. 17.

FIG. 17 is a schematic diagram showing a cross-sectional structure of an optical semiconductor device according to Embodiment 6 of the invention, and FIG. 18 is a diagram showing a top-view shape of a one-sided Fresnel lens in FIG. 17. An optical semiconductor device 50 of Embodiment 6 is an example of an optical semiconductor device provided with: a light transmitter including a light emitting unit for emitting light of multiple wavelengths; and a light receiver including a plurality of light receiving units corresponding to the wavelengths of the light emitted from the light transmitter. The optical semiconductor device 50 of Embodiment 6 is an optical semiconductor device which includes a light transmitter 53 and a light receiver 54 and in which the light transmitter 53 and the light receiver 54 are bonded together using an interlayer film 113 made of an organic or inorganic material. The light transmitter 53 includes: a semiconductor substrate 131 on which an integrated circuit 104 such as a signal processing circuit or the like and an integrated circuit 105 such as a power circuit or the like are formed; a light emitting unit 132 provided (formed or mounted) on the semiconductor substrate 131, for emitting concurrently or in a time-division manner, optical signals 16 including optical signals of the multiple wavelengths; an interlayer film 31 as a $SiO_2$-based film; and a protective film 81 as a SiN film that covers a one-sided Fresnel lens 133 formed on a surface of the interlayer film 31. The light emitting unit 132 is a planar light-emitting structural unit, such as a laser diode or the like, for emitting optical signals of the multiple wavelengths, concurrently or in a time-division manner. The one-sided Fresnel lens 133 in the light transmitter 53 is a Fresnel lens for radiating light that is formed in a distant region apart from the light emitting unit 132 in a direction perpendicular thereto, namely, on the surface of the interlayer film 31 (its surface on the side opposite to the side facing the semiconductor substrate 131).

The one-sided Fresnel lens 133 includes four convex portions 142a, 142b, 142c and 142d between a broken line 143a and a broken line 143b. The respective convex portions 142a, 142b, 142c, 142d correspond to shapes obtained when the convex portions 62a, 62b, 62c, 62d in the Fresnel lens 61 of FIG. 6 are modified to have open shapes instead of the ring shapes and, for example, they are formed into silt shapes as shown in FIG. 18. Regarding the adjacent convex portions, a largest level difference appears at a boundary therebetween, and each of the convex portions protrudes upward (toward a far side apart from the semiconductor substrate 131 in a direction perpendicular thereto) in a manner gradually rising along a direction toward the left side in FIG. 18. In other words, each concave portion sandwiched between the convex portions is deepest at its right side in FIG. 18, and becomes shallower gradually along a direction toward the left side in FIG. 18.

The light receiver 54 includes: a semiconductor substrate 134 on which an integrated circuit 104 such as a signal processing circuit or the like and an integrated circuit 105 such as a power circuit or the like are formed; a light receiving unit 135 provided (formed or mounted) on the semiconductor substrate 134, for receiving an optical signal 17a of a short wavelength; a light receiving unit 136 provided (formed or mounted) on the semiconductor substrate 134, for receiving an optical signal 17b of a long wavelength; and an interlayer film 31 as a $SiO_2$-based film. The light receiving units 135, 136 are each a planar light-receiving structural unit, such as an avalanche photodiode (APD) or the like.

The manufacturing steps of the light transmitter 53 are similar to the manufacturing steps described in Embodiment 1. In a manufacturing step of the one-sided Fresnel lens 133, a resist pattern is formed so as to have a top-view shape that is matched to the top-view shape of the one-sided Fresnel lens 133 in FIG. 18, and to have a cross-sectional shape that corresponds to a shape in the resist pattern 41 in FIG. 5 from the center of the convex portion 62a (see, FIG. 6) to the right side. The manufacturing steps of the light receiver 54 are similar to manufacturing steps up to the planarization of the interlayer film 31 in the manufacturing steps disclosed in Embodiment 1.

Figure 19:
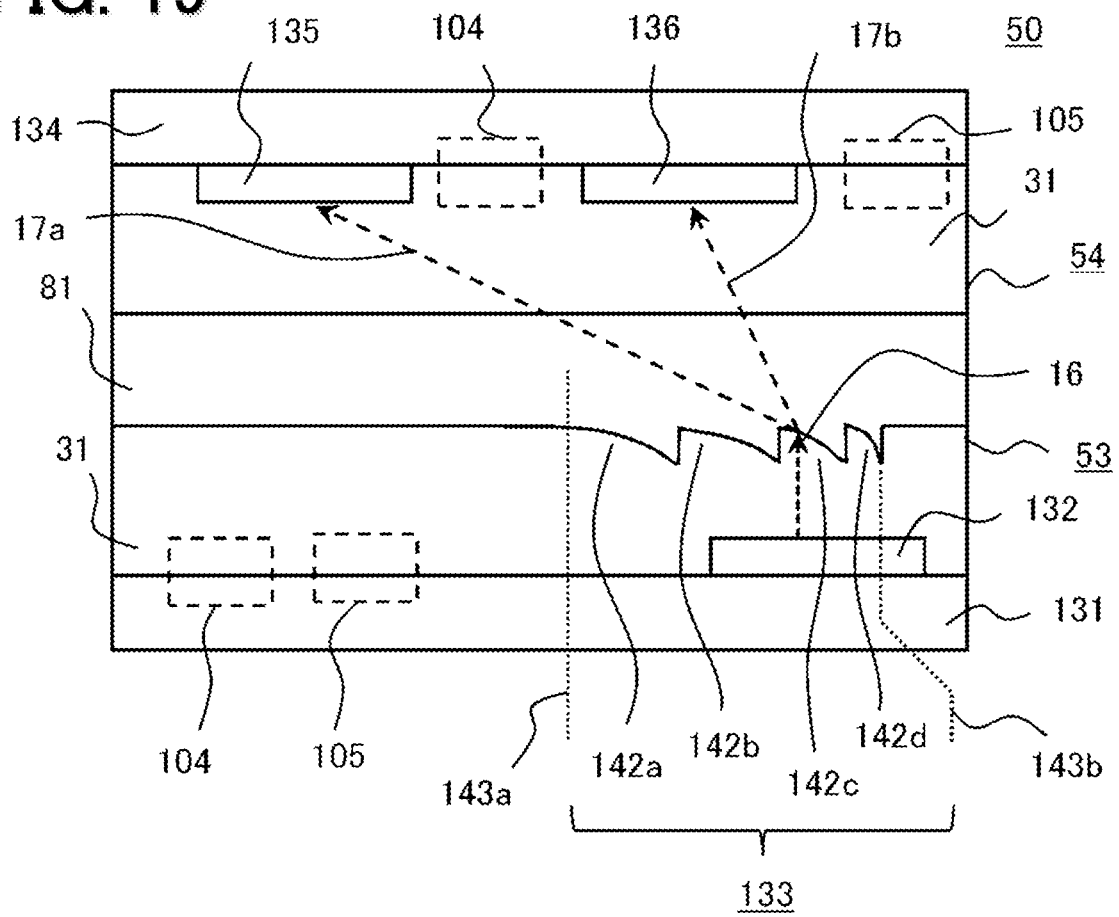
FIG. 19 is a schematic diagram showing a cross-sectional structure of another optical semiconductor device according to Embodiment 6 of the invention.

In FIG. 17, an example of the optical semiconductor 50 is shown in which the light transmitter 53 and the light receiver 54 are bonded together using the interlayer film 113 made of an organic or inorganic material. However, since the surface of the light transmitter 53 that is farthest apart from the semiconductor substrate 131 in a direction perpendicular thereto is provided by the planarized protective film 81, and the surface of the light receiver 54 that is farthest apart from the semiconductor substrate 134 in a direction perpendicular thereto is provided by the planarized interlayer film 31, it is allowable, as shown in FIG. 19, to directly bond the light transmitter 53 and the light receiver 54 together using a van der Waals force by tightly contacting them. FIG. 19 is a schematic diagram showing a cross-sectional structure of another optical semiconductor device according to Embodiment 6 of the invention. The other optical semiconductor device 50 shown in FIG. 19 differs from the optical semiconductor device 50 shown in FIG. 17 in that the interlayer film 113 is not provided and the light transmitter 53 and the light receiver 54 are directly bonded together using a van der Waals force in a tightly contacted state. Note that the examples shown in FIG. 17 and FIG. 19 are each illustrated as a case of using two wavelengths; however, if the number of the light receiving units is increased, it is also possible to apply the example to a case of using multiple wavelengths.

Operations and effects according to the optical semiconductor device 50 of Embodiment 6 will be described. When the optical signals 16 including the optical signals 17a, 17b of two wavelengths are emitted by the light emitting unit 132 as a planar light-emitting structural unit such as a laser diode or the like, as shown in FIG. 17 and FIG. 19, the optical signals 17a, 17b are then refracted by angles according to their wavelengths, due to a spectroscopic effect of the one-sided Fresnel lens 133 formed on the interlayer film 31 as a $SiO_2$-based film, to thereby pass through the protective film 81 as a SiN film formed in a distant region in the traveling direction of each of these signals. The refractive index of the protective film 81 is 1.9 and thus, the refractive index of the protective film 81 is larger than the refractive index of 1.4 of the interlayer film 31, so that, at the boundary between the interlayer film 31 and the protective film 81, the optical signals are further refracted to the center side of the one-sided Fresnel lens 133 (to a broken line 143a-side). This makes it possible to enlarge the separation angle between the optical signals 17a, 17b of two wavelengths.

The optical signals 17a, 17b separated according to their wavelengths enter the opposing light receiver 54, so that the optical signal 17a of a short wavelength is received by the light receiving unit 135 and the optical signal 17b of a long wavelength is received by the light receiving unit 136. They are subjected to analog or digital-signal processing on the semiconductor substrate 134. The optical signals 17a, 17b of the respective wavelengths received by the light receiving units 135, 136 are subjected to analog or digital-signal processing by the integrated circuit 104 such as a signal processing circuit or the like, formed on the semiconductor substrate 134, and the processed signals are each electrically or optically transmitted to an external system. Note that, when the processed signal is electrically transmitted to an external system, it is transmitted from an unshown electrode unit 107 (see, FIG. 15) disposed in the light receiver 54. When the processed signal is optically transmitted to an external system, it is transmitted from an unshown light emitting unit 122 (see, FIG. 15) formed or mounted on the semiconductor substrate 134.

According to the optical semiconductor device 50 of Embodiment 6, since optical communication between the light transmitter 53 and the light receiver 54 is established through a shortest path, it is possible to reduce to a minimum the output power of each of the optical signals 16, 17a, 17b.

Meanwhile, in the optical semiconductor device 50 of Embodiment 6, in accordance with the wavelengths of the optical signals 17a, 17b and the path, the focal length of the one-sided Fresnel lens 133 is adjusted optimally by adjustment of the film thickness of the interlayer film 31 as a $SiO_2$-based film, the intervals between the convex portions in the pattern of the one-sided Fresnel lens 133 and/or the dry etching depth thereof. Further, in the optical semiconductor device 50 of Embodiment 6, the protective films 81 exists in a distant region in the light transmitter 53 that is apart from the semiconductor substrate 131 in a direction perpendicular thereto, namely, on the surface of the interlayer film 31 (its surface on the side opposite to the side facing the semiconductor substrate 131), so that sufficient resistance to humidity is ensured for the light transmitter 53. Further, in the optical semiconductor device 50 of Embodiment 6, a distant region in the light receiver 54 that is apart from the semiconductor substrate 134 in a direction perpendicular thereto, namely, the surface of the interlayer film (its surface on the side opposite to the side facing the semiconductor substrate 134) is covered by the protective film 81 of the light transmitter 53 through the interlayer film 113 made of an organic or inorganic material, or covered directly by the protective film 81 of the light transmitter 53, so that sufficient resistance to humidity is ensured for the light receiver 54.

In the optical semiconductor device 50 of Embodiment 6, the optical signals 16 including multiple wavelengths and emitted from the light emitting unit 132 of the light transmitter 53 are spectrally dispersed by the Fresnel lens 133 formed on the interlayer film 31, and received by the respective light receiving units 135, 136 corresponding to the wavelengths in the light transmitter 54, and are then subjected to signal processing. Thus, the number of optical-signal communication channels is increased to a multiple thereof according to the number of wavelengths, resulting in increased communication speed. Further, according to the optical semiconductor device 50 of Embodiment 6, since the number of optical-signal communication channels is increased to a multiple thereof according to the number of wavelengths, it is possible to achieve downsizing and cost reduction as compared with the conventional device. Furthermore, the optical semiconductor device 50 of Embodiment 6 can prevent the optical signals 16, 17a, 17b from being dispersed and diminished, so that it is possible to also achieve reduction in power consumption.

According to the optical semiconductor device 50 of Embodiment 6, since, like in Embodiment 4, the light transmitter 53 and the light receiver 54 as two semiconductor devices are bonded together and optical signals are used for communication from the light transmitter 53 to the light receiver 54, it becomes possible to reduce the number of the components and to decrease the area, significantly. In the light transmitter 53, the one-sided Fresnel lens 133 was formed by a wafer manufacturing process (in the wafer manufacturing steps) on a far side of the light emitting unit 132 for transmitting the optical signals, apart from the semiconductor substrate 131 in a direction perpendicular thereto. This makes it possible for the light transmitter 53 as an optical semiconductor device to achieve downsizing, reduction in power consumption and cost reduction. Further, in the light receiver 54, no lens was formed on the surface of the interlayer film 31 (its surface on the side opposite to the side facing the semiconductor substrate 134) that is placed on a far side of the light receiving units 135, 136 for receiving optical signals, apart from the semiconductor substrate 134 in a direction perpendicular thereto. This makes it possible for the light receiver 54 as an optical semiconductor device to achieve downsizing, reduction in power consumption and cost reduction. Furthermore, it becomes possible also for the optical semiconductor device 50 of Embodiment 6 in which the light transmitter 53 and the light receiver 54 as two semiconductor devices are bonded together, to achieve downsizing, reduction in power consumption and cost reduction.

Embodiment 7

Figure 20:
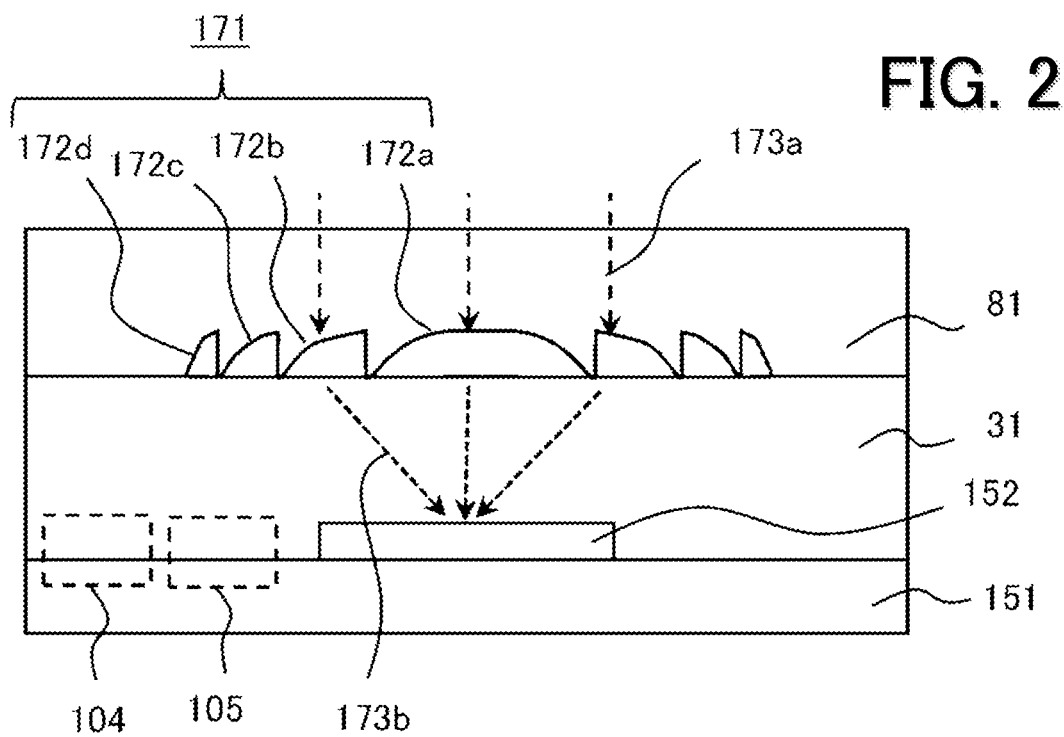
FIG. 20 is a schematic diagram showing a cross-sectional structure of an optical semiconductor device according to Embodiment 7 of the invention.
Figure 21:
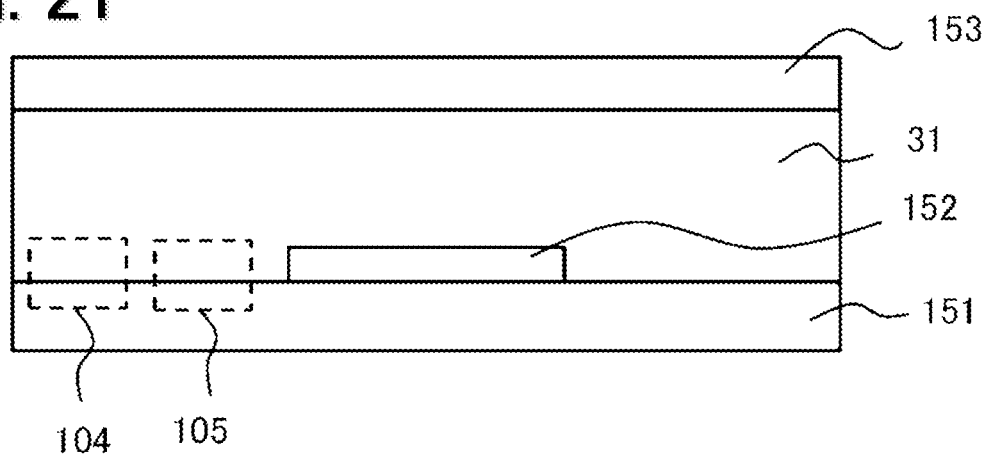
FIG. 21 is a diagram illustrating a wafer manufacturing step for the optical semiconductor device of FIG. 20.
Figure 22:
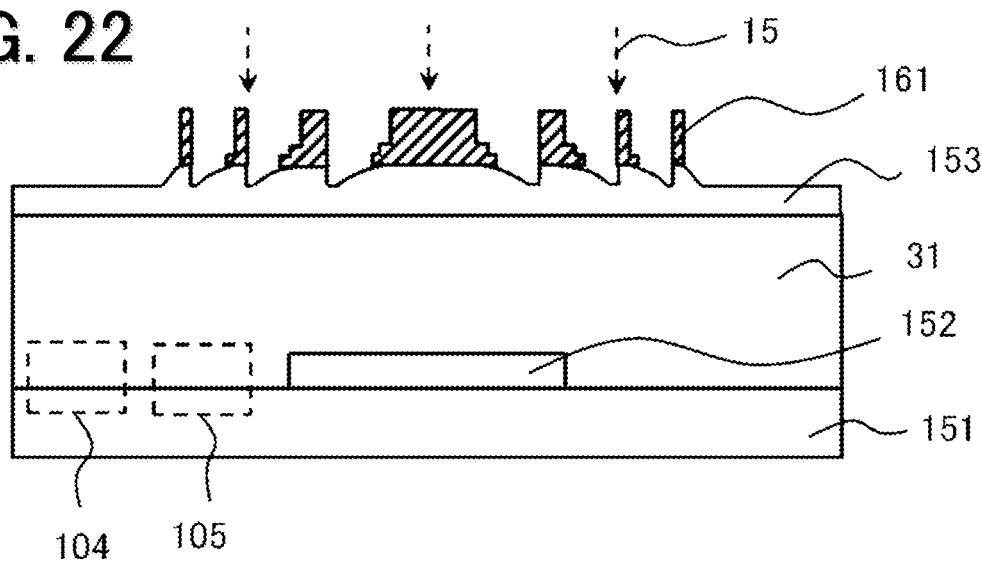
FIG. 22 is a diagram illustrating a wafer manufacturing step for the optical semiconductor device of FIG. 20.
Figure 23:
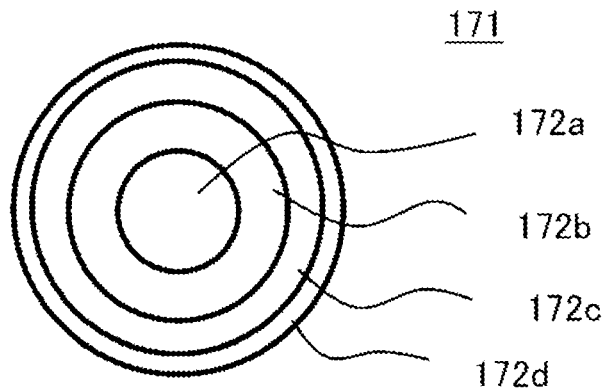
FIG. 23 is a diagram showing a top-view shape of a Fresnel lens in FIG. 20.

FIG. 20 is a schematic diagram showing a cross-sectional structure of an optical semiconductor device according to Embodiment 7 of the invention. FIG. 21 and FIG. 22 are diagrams each illustrating a wafer manufacturing step for the optical semiconductor device of FIG. 20. FIG. 23 is a diagram showing a top-view shape of a Fresnel lens in FIG. 20. An optical semiconductor device 50 of Embodiment 7 is an example of a highly-functional optical semiconductor device, such as an infrared sensor or the like, that includes an integrated circuit, an infrared-light receiving unit and a Fresnel lens. The optical semiconductor device 50 of Embodiment 7 includes: a semiconductor substrate 151 on which an integrated circuit 104 such as a signal processing circuit or the like and an integrated circuit 105 such as a power circuit or the like, are formed; an infrared-light receiving unit 152 formed on the semiconductor substrate 151; an interlayer film 31 as a $SiO_2$-based film; a Fresnel lens 171 of a polysilicon or amorphous silicon provided on a surface of the interlayer film 31; and a protective film 81 as a SiN film that covers the Fresnel lenses 171. The infrared-light receiving unit 152 is a planar light-receiving structural unit for receiving infrared light. The infrared-light receiving unit for receiving an infrared signal is a light receiving unit for receiving an optical signal of infrared light.

Wafer manufacturing steps for the optical semiconductor device 50 of Embodiment 7 will be described. As shown in FIG. 21, the infrared-light receiving unit 152 is formed on the semiconductor substrate 151 on which the integrated circuit 104 such as a signal processing circuit or the like and the integrated circuit 105 such as a power circuit or the like are formed. The semiconductor substrate 151 on which the integrated circuits 104, 105 and the infrared-light receiving unit 152 are formed is a substrate before lens formation. Thereafter, the planarized interlayer film 31 as a $SiO_2$-based film is formed as described in Embodiment 1, and a silicon film 153 made of polysilicon or amorphous silicon and provided as a material for the Fresnel lens 171, is formed on the surface of the interlayer film 31. The film thickness of the silicon film 153 is 0.1 to 1.0 μm.

Then, as shown in FIG. 22, in order to form the Fresnel lens 171 on the surface of the silicon film 153, a resist pattern 161 for forming the Fresnel lens is developed by a multi-exposure photolithographic technique using an electron beam method (EB (Electron Beam) method). The resist pattern 161 is arranged so that convex portions 172a, 172b, 172c and 172d will be left. Further, the resist pattern 161 is formed to be matched to the shapes of concave portions between respective adjacent convex portions, for example, it is formed so as to have stepped shapes in each of which the thickness corresponding to a low-height part in the convex portion is thin whereas the thickness corresponding to a high-height part in said convex portion is thick. Further, the resist pattern 161 is arranged so that a portion of the silicon film 153 outside the region of the Fresnel lens 171 will be removed off. As shown in FIG. 22, the convex portions 172*a*, 172*b*, 172*c*, 172*d* of the Fresnel lens 171 are formed by a dry etching method. FIG. 22 shows convex portions of the Fresnel lens 171 during etching, and shows a state where the resist pattern 161 is left on the convex portions of the Fresnel lens 171 after the resist portions for the respective low-height parts in the convex portions have disappeared gradually with the progress of etching by etching ions 15 for the convex portions.

The top-view shape of the Fresnel lens 171 is, for example, a concentric circle shape as shown in FIG. 23. Generally, as the top-view shape of the Fresnel lens 171, a concentric circle shape is applied as shown in FIG. 23. Instead, the top-view shape of the Fresnel lens 171 may be, similarly to FIG. 9 or FIG. 10, a square shape provided with curvatures at four corners or a rectangle shape provided with curvatures at four corners, and may be another shape. The shape of the Fresnel lens 171 is selected according to the shape of the infrared-light receiving unit 152. The resist pattern 161 is formed so as to have fine widths of residual resist corresponding to the top-view shape of the Fresnel lens 171. The resist pattern 161 for forming the top-view shape of FIG. 23, is formed so that a width of residual resist for forming the center convex portion 172*a* is wider than a width of residual resist for forming each of the other convex portions 172*b*, 172*c* and 172*d*, and the width of residual resist for forming each of the convex portions 172*b*, 172*c* and 172*d* becomes gradually narrower in that order.

After completion of the etching step for the Fresnel lens 171 and removal of the resist pattern 161, in order to ensure resistance to humidity, the protective film 81 that is a SiN film having a refractive index larger than that of the interlayer film 31 as a SiO$_2$-based film and having a film thickness of 1.0 to 3.0 μm, is deposited by a CVD method or the like so as to cover the Fresnel lens 171 and the interlayer film 31, and is then planarized. Note that the Fresnel lens 171 has been described citing a case of using silicon element, such as using a polysilicon or amorphous silicon film; however, a material consisting of germanium element or a compound of germanium and silicon may instead be used.

Operations and effects according to the optical semiconductor device 50 of Embodiment 7 will be described. An infrared signal 173*a* having a wavelength A of 1.1 to 1.5 μm enters the planarized protective film 81 as a SiN film, so that an infrared signal 173*b* converged by the Fresnel lens 171 formed on the interlayer film 31 as a SiO$_2$-based film under the protective film 81, is received by the infrared-light receiving unit 152. The refractive index of the protective film 81 is 1.9 and the refractive index of the interlayer film 31 is 1.4, so that the optical semiconductor device 50 of Embodiment 7 can converge infrared signals at wide angles, and thus can detect a weak signal. Further, according to the optical semiconductor device 50 of Embodiment 7, since an unwanted infrared signal having a wavelength A other than 1.1 to 1.5 μm, is reflected off or absorbed by the Fresnel lens 171, the unwanted infrared signal will not be received by the infrared-light receiving unit 152, so that the light-receiving sensitivity for the infrared signal 173*b* having a specific wavelength, namely, having a wavelength A of 1.1 to 1.5 μm, is enhanced.

The received infrared signal 173*b* is subjected to analog or digital-signal processing by the integrated circuit 104 such as a signal processing circuit or the like, formed on the semiconductor substrate 151, so that the presence, the distance and the position of an infrared-light emitting object are determined through calculation, and then information of the presence, the distance and the position of the object is transmitted to another control system on the outside of the optical semiconductor device 50. Meanwhile, in accordance with the wavelength of the infrared signal 173*a*, 173*b*, the focal length of the Fresnel lens 171 is adjusted on the basis of the film thickness of the interlayer film 31 as a SiO$_2$-based film, the intervals between the concentric circles in the pattern of the Fresnel lens 171 and the dry etching depth thereof. Further, in the optical semiconductor device 50 of Embodiment 7, the protective film 81 exists at the top thereof, so that sufficient resistance to humidity is ensured.

The conventional infrared sensor does not employ an infrared-light collection lens, or is required to have a module configuration in which an independent lens is assembled with an independent package. Unlike this, according to the optical semiconductor device 50 of Embodiment 7, the Fresnel lens 171 is formed in the wafer manufacturing steps for the optical semiconductor device including the infrared-light receiving unit 152, so that the manufacturing steps thereof are simplified, and the number of components thereof can be reduced to thereby achieve downsizing, as compared with the conventional device. According to the optical semiconductor device 50 of Embodiment 7, since the Fresnel lens 171 is formed in the wafer manufacturing steps for the optical semiconductor device including the infrared-light receiving unit 152, it is possible to eliminate such a step of assembling an independent lens with an independent package, and thus to reduce the number of the manufacturing steps. According to the optical semiconductor 50 of Embodiment 7, since the number of the components and the number of the manufacturing steps are reduced, it becomes possible to achieve cost reduction. Furthermore, according to the optical semiconductor device 50 of Embodiment 7, since unwanted infrared light is reflected or absorbed, it becomes possible also to achieve enhancement in the sensitivity and reduction in power consumption.

Embodiment 8

Figure 24:
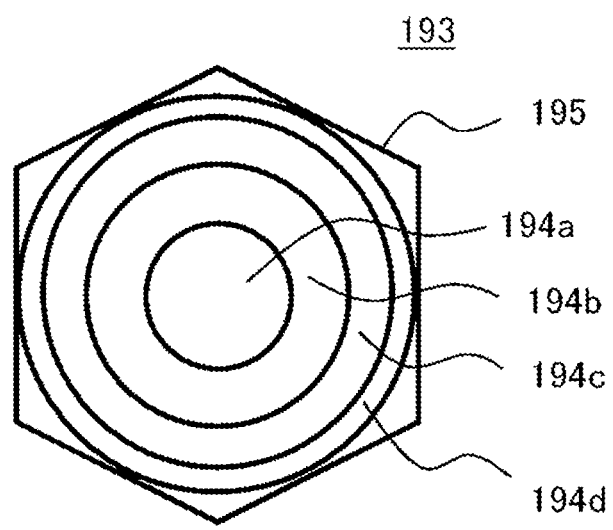
FIG. 24 is a diagram showing a top-view shape of a Fresnel lens according to Embodiment 8 of the invention.
Figure 25:
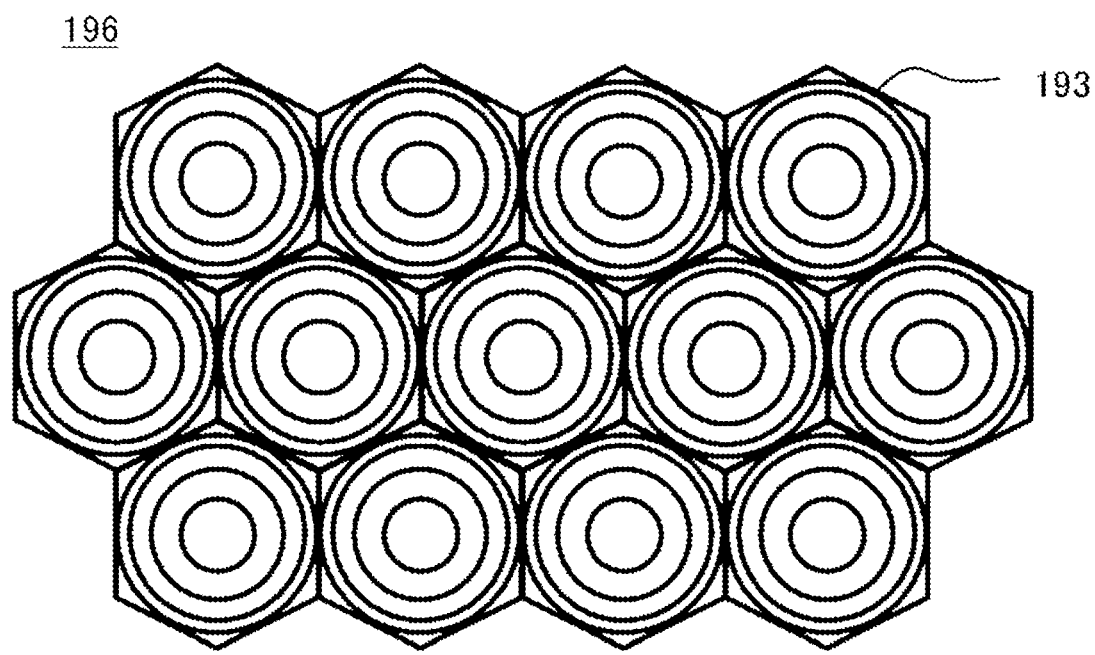
FIG. 25 is a diagram showing a top-view shape of a lens array according to Embodiment 8 of the invention.
Figure 26:
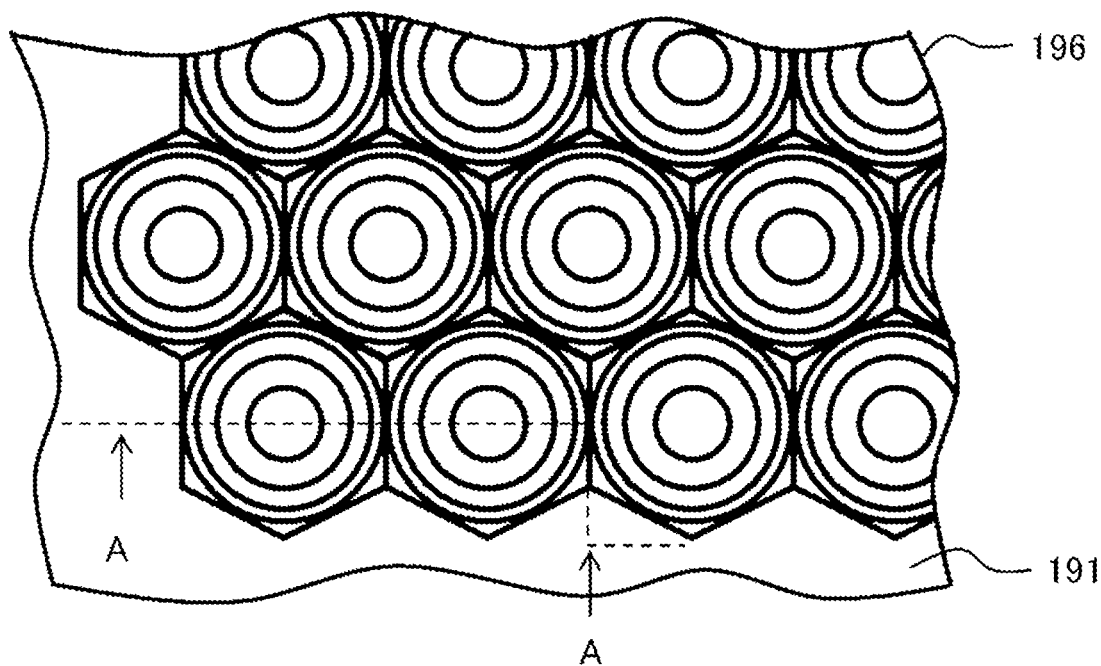
FIG. 26 is a schematic diagram showing a top view of an optical semiconductor device according to Embodiment 8 of the invention.
Figure 27:
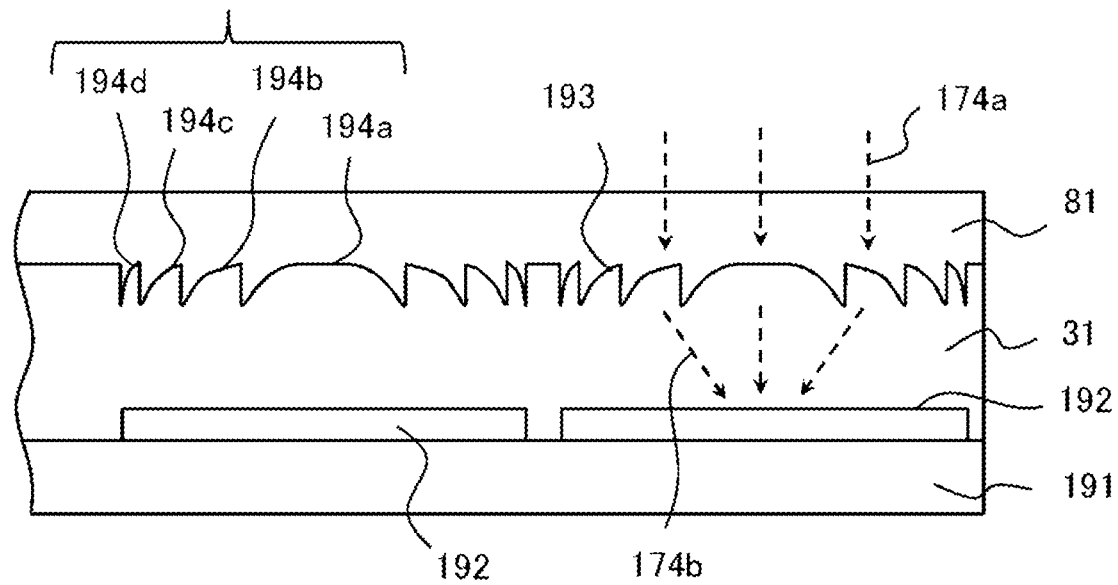
FIG. 27 is a schematic diagram showing a cross-sectional structure of an optical semiconductor device of FIG. 26.

FIG. 24 is a diagram showing a top-view shape of a Fresnel lens according to Embodiment 8 of the invention, and FIG. 25 is a diagram showing a top-view shape of a lens array according to Embodiment 8 of the invention. FIG. 26 is a schematic diagram showing a top view of an optical semiconductor device according to Embodiment 8 of the invention, and FIG. 27 is a schematic diagram showing a cross-sectional structure of the optical semiconductor device of FIG. 26. FIG. 27 is a schematic diagram showing a cross-sectional structure cut along A-A in FIG. 26. The optical semiconductor device 50 of Embodiment 8 is an example of an optical semiconductor device as represented by solar-battery cells or the like, and including an array of Fresnel lenses each having a regular hexagonal shape. The optical semiconductor device 50 of Embodiment 8 includes: a solar-battery cell substrate 191 as a semiconductor substrate; light receiving units 192 provided (formed) on the solar-battery cell substrate 191, for receiving sunlight; an interlayer film 31 as a SiO$_2$-based film; Fresnel lenses 193 provided on the surface of the interlayer film 31; and a protective film 81 as a SiN film that covers the Fresnel lenses 193. In the optical semiconductor device 50 of Embodiment 8, the light receiving units 192 are laid out as a pattern on the surface of the solar-battery cell substrate 191 so that the light receiving units 192 are respectively placed beneath the Fresnel lenses 193 each having a regular hexagonal shape. The light receiving units 192 are each a planar light-receiving structural unit, such as an avalanche photodiode (APD) or the like.

The Fresnel lens 193 has a circumference 195 whose top-view shape is regular hexagon, and includes four convex portions 194a, 194b, 194c and 194d that are formed circularly and concentrically. The convex portions 194a, 194b, 194c, 194d are similar to the convex portions 62a, 62b, 62c, 62d in the Fresnel lens 61 of Embodiment 1. The manufacturing steps of the optical semiconductor device 50 of Embodiment 8 are similar to the manufacturing steps described in Embodiment 1.

Operations and effects according to the optical semiconductor device 50 of Embodiment 8 will be described. For a solar battery, it is required to enhance sunlight incidence efficiency. However, the basic structure of the Fresnel lens illustrated in Embodiment 1 is a concentric ring structure, and according to the top-view shape of such a concentric ring, it is unable to completely cover a planar face. Thus, in the case where Fresnel lenses are applied to the solar-battery cells as an optical semiconductor device for receiving light in the solar battery, the shape per unit Fresnel lens is set to a regular hexagonal shape as shown in FIG. 24, and the Fresnel lenses 193 each having the regular hexagonal shape are laid out into an array form in a staggered manner as shown in FIG. 25. This makes it possible to maximally utilize the area of the solar-battery cells, namely, to increase the filling ratio (filling rate) of the basic structure including the light receiving unit 192 and the Fresnel lens 193, relative to the area of the solar-battery cells. A lens array 196 shown in FIG. 25 is an example in which thirteen Fresnel lenses 193 are arranged.

As shown in FIG. 27, sunlight 174a enters the planarized protective film 81 as a SiN film, so that sunlight 174b converged by the Fresnel lens 193 formed on the interlayer film 31 as a $SiO_2$-based film under the protective film 81, is received by the light receiving unit 192. The refractive index of the protective film 81 is 1.9 and the refractive index of the interlayer film 31 is 1.4, so that the optical semiconductor device 50 of Embodiment 8 can converge sunlight at angles wider than those by conventional solar-battery cells without using lenses. Further, according to the optical semiconductor device 50 of Embodiment 8, the sunlight-absorption efficiency of the solar-battery cells is enhanced in such a manner that the focal length of the Fresnel lens 193 is adjusted in accordance with the wavelength of the sunlight 174a, 174b, on the basis of the film thickness of the interlayer film 31 as a $SiO_2$-based film, the intervals between the concentric circles in the pattern of the Fresnel lens 193 and the dry etching depth thereof. Further, in the optical semiconductor device 50 of Embodiment 8, the protective film 81 exists at the top thereof, so that sufficient resistance to humidity is ensured.

It is noted that the description has been made about solar-battery cells as an example of the optical semiconductor device 50 including an array of Fresnel lenses each having a regular hexagonal shape; however, the multiple Fresnel lenses may be laid out into an array form above light receiving units, other than the light receiving units 192 for receiving sunlight, such as light receiving units for receiving other light such as an optical signal(s), an infrared signal(s) or the like. An optical semiconductor device 50 in which the light receiving units for receiving an optical signal(s), an infrared signal(s) or the like are arranged respectively under the Fresnel lenses 193 each having a regular hexagonal shape, also accomplishes effects equivalent to those by the optical semiconductor device 50 of Embodiment 8.

According to the optical semiconductor device 50 of Embodiment 8, since the Fresnel lenses 193 each having a regular hexagonal shape are formed in the wafer manufacturing steps for the solar-battery cells, it is possible to efficiently utilize the light receiving area on the surface of the solar-battery cells. When the lens-arrangement configuration according to Embodiment 8 is applied to a solar battery, it is possible to increase the light-collection efficiency of sunlight per area, thus making it possible to enhance the power conversion efficiency of the solar battery. Note that, according to an optical semiconductor device 50 in which a plurality of light receiving units for receiving optical signals, infrared signals or the like and a plurality of light emitting units for emitting optical signals, infrared signals or the like, are arranged beneath their respective Fresnel lenses 193 each having a regular hexagonal shape, it is possible to increase the filling ratio (filling rate) of the basic structure including the light receiving unit and the Fresnel lens and the basic structure including the light emitting unit and the Fresnel lens, and thus to reduce the area of the optical semiconductor device.

It should be noted that unlimited combination of the respective embodiments and any appropriate modification and omission in the embodiments may be made in the present invention to the extent without causing contradiction.

DESCRIPTION OF REFERENCE NUMERALS AND SIGNS 8a, 8b: optical signal, 9a, 9b: optical signal, 11: semiconductor substrate, 12: light receiving unit, 13a, 13b, 13c, 13d: optical signal, 16: optical signal, 17a, 17b: optical signal, 21: interlayer film, 31: interlayer film, 50: optical semiconductor device, 51: light transceiver, 52: light transceiver, 53: light transmitter, 54: light receiver, 61, 61a, 61b: Fresnel lens, 71: protective film, 81: protective film, 91: light emitting unit, 101: semiconductor substrate, 102: light emitting unit, 103: light receiving unit, 104: integrated circuit, 105: integrated circuit, 113: interlayer film, 114: light emitting unit, 115: light receiving unit, 121: semiconductor substrate, 122: light emitting unit (external system-related light emitting unit), 123: light receiving unit (external system-related light receiving unit), 131: semiconductor substrate, 132: light emitting unit, 133: one-sided Fresnel lens, 135: light receiving unit, 136: light receiving unit, 151: semiconductor substrate, 152: infrared-light receiving unit, 171: Fresnel lens, 173a, 173b: infrared signal (optical signal), 174a, 174b: sunlight, 191: solar-battery cell substrate (semiconductor substrate), 192: light receiving unit, 193: Fresnel lens.

The invention claimed is:

1. An optical semiconductor device which comprises a first light transceiver provided with a first semiconductor substrate and a second light transceiver provided with a second semiconductor substrate, and in which optical signal communication is established mutually between these transceivers, said first light transceiver comprising:

the first semiconductor substrate;

a light receiving unit for receiving an optical signal and a light emitting unit for emitting the optical signal, that are provided on the first semiconductor substrate;

a first interlayer film that covers the first semiconductor substrate, the light receiving unit and the light emitting unit;

Fresnel lenses through which the optical signals pass, that are provided respectively for the light receiving unit and the light emitting unit, and provided on a planarized surface of the first interlayer film placed on its side farther from the first semiconductor substrate; and a first protective film that covers the Fresnel lenses and the first interlayer film, whose refractive index is larger than that of the first interlayer film, and whose surface placed on its side farther from the first interlayer film is planarized; and said second light transceiver comprising:

the second semiconductor substrate;

a light receiving unit for receiving an optical signal and a light emitting unit for emitting the optical signal, that are provided on the second semiconductor substrate;

a second interlayer film that covers the second semiconductor substrate, the light receiving unit and the light emitting unit;

Fresnel lenses through which the optical signals pass, that are provided respectively for the light receiving unit and the light emitting unit, and provided on a planarized surface of the second interlayer film placed on its side farther from the second semiconductor substrate; and a second protective film that covers the Fresnel lenses and the second interlayer film, whose refractive index is larger than that of the second interlayer film, and whose surface placed on its side farther from the second interlayer film is planarized;

wherein the light receiving unit in the first light transceiver and the light emitting unit in the second light transceiver are placed so as to face each other, and the light emitting unit in the first light transceiver and the light receiving unit in the second light transceiver are placed so as to face each other; and wherein the first protective film in the first light transceiver and the second protective film in the second light transceiver are bonded together directly or through a third interlayer film.

2. The optical semiconductor device of claim 1, wherein the first light transceiver includes an external system-related optical communication unit that is an external system-related light receiving unit for receiving an optical signal from an external system other than the second light transceiver; or an external system-related light emitting unit for emitting an optical signal to the external system.

3. The optical semiconductor device of claim 1, wherein the first light transceiver includes: an external system-related light receiving unit for receiving an optical signal from an external system other than the second light transceiver; and an external system-related light emitting unit for emitting an optical signal to the external system.

4. The optical semiconductor device of claim 2, wherein the external system-related optical communication unit is the external system-related light receiving unit;

wherein a plurality of external system-related light receiving units, each being said external system-related light receiving unit, are provided on the first semiconductor substrate;

wherein the Fresnel lens is further formed for each of the external system-related light receiving units, said Fresnel lens having a circumference of a regular hexagonal shape in a plane parallel to the first semiconductor substrate; and wherein the Fresnel lenses adjacent to each other are arranged so that the circumferences thereof are in contact with each other.

5. The optical semiconductor device of claim 3, wherein a plurality of external system-related light receiving units, each being said external system-related light receiving unit, are provided on the first semiconductor substrate;

wherein the Fresnel lens is further formed for each of the external system-related light receiving units, said Fresnel lens having a circumference of a regular hexagonal shape in a plane parallel to the first semiconductor substrate; and wherein the Fresnel lenses adjacent to each other are arranged so that the circumferences thereof are in contact with each other.

6. The optical semiconductor device of claim 1, wherein the first light transceiver comprises a first integrated circuit provided on the first semiconductor substrate, and the second light transceiver comprises a second integrated circuit provided on the second semiconductor substrate; and wherein the first integrated circuit and the second integrated circuit each performs signal processing after converting the optical signal received by the corresponding light receiving unit into an electrical signal, and generates an electrical signal serving as a basis for the optical signal to be emitted by the corresponding light emitting unit.

7. An optical semiconductor device, comprising: a light transmitter for emitting concurrently or in a time-division manner, optical signals that includes multiple wavelengths, respectively; and a light receiver that is placed so as to face the light transmitter, for receiving the optical signals from the light transmitter according to their respective wavelengths;

wherein the light transmitter comprises:

a first semiconductor substrate;

a light emitting unit provided on the first semiconductor substrate, for emitting the optical signals;

a first interlayer film that covers the first semiconductor substrate and the light emitting unit;

a one-sided Fresnel lens through which the optical signals pass, that is formed on a planarized surface of the first interlayer film placed on its side farther from the first semiconductor substrate; and a first protective film that covers the one-sided Fresnel lens and the first interlayer film, whose refractive index is larger than that of the first interlayer film, and whose surface placed on its side farther from the first interlayer film is planarized; and wherein the light receiver comprises:

a second semiconductor substrate;

a plurality of light receiving units that are provided on the second semiconductor substrate, for receiving the optical signals whose refracted angles were differently set according to their respective wavelengths by the one-sided Fresnel lens of the light transmitter; and a second interlayer film that covers the second semiconductor substrate and the plurality of light receiving units; and wherein the first protective film in the light transmitter and the second interlayer film in the light receiver are bonded together directly or through a third interlayer film.

8. The optical semiconductor device of claim 2, wherein the first light transceiver comprises a first integrated circuit provided on the first semiconductor substrate, and the second light transceiver comprises a second integrated circuit provided on the second semiconductor substrate; and wherein the first integrated circuit and the second integrated circuit each performs signal processing after converting the optical signal received by the corresponding light receiving unit into an electrical signal, and generates an electrical signal serving as a basis for the optical signal to be emitted by the corresponding light emitting unit.

9. The optical semiconductor device of claim 3, wherein the first light transceiver comprises a first integrated circuit provided on the first semiconductor substrate, and the second light transceiver comprises a second integrated circuit provided on the second semiconductor substrate; and wherein the first integrated circuit and the second integrated circuit each performs signal processing after converting the optical signal received by the corresponding light receiving unit into an electrical signal, and generates an electrical signal serving as a basis for the optical signal to be emitted by the corresponding light emitting unit.

10. The optical semiconductor device of claim 4, wherein the first light transceiver comprises a first integrated circuit provided on the first semiconductor substrate, and the second light transceiver comprises a second integrated circuit provided on the second semiconductor substrate; and wherein the first integrated circuit and the second integrated circuit each performs signal processing after converting the optical signal received by the corresponding light receiving unit into an electrical signal, and generates an electrical signal serving as a basis for the optical signal to be emitted by the corresponding light emitting unit.

11. The optical semiconductor device of claim 5, wherein the first light transceiver comprises a first integrated circuit provided on the first semiconductor substrate, and the second light transceiver comprises a second integrated circuit provided on the second semiconductor substrate; and wherein the first integrated circuit and the second integrated circuit each performs signal processing after converting the optical signal received by the corresponding light receiving unit into an electrical signal, and generates an electrical signal serving as a basis for the optical signal to be emitted by the corresponding light emitting unit.

* * * * *